United States Patent
Ghosh et al.

(10) Patent No.: US 12,413,212 B2
(45) Date of Patent: Sep. 9, 2025

(54) METHODS AND APPARATUS TO IMPROVE PERFORMANCE OF VOLTAGE TO DELAY CONVERTERS

(71) Applicant: Texas Instruments Incorporated, Dallas, TX (US)

(72) Inventors: Sovan Ghosh, Bengaluru (IN); Visvesvaraya Appala Pentakota, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 200 days.

(21) Appl. No.: 18/241,080

(22) Filed: Aug. 31, 2023

(65) Prior Publication Data
US 2025/0080096 A1 Mar. 6, 2025

(51) Int. Cl.
- H03M 1/12 (2006.01)
- H03K 5/01 (2006.01)
- H03K 5/00 (2006.01)

(52) U.S. Cl.
CPC .......... H03K 5/01 (2013.01); H03M 1/1245 (2013.01); H03K 2005/00078 (2013.01)

(58) Field of Classification Search
CPC .................................................. H03M 1/1245
USPC ...................................................... 341/155
See application file for complete search history.

(56) References Cited

U.S. PATENT DOCUMENTS

| | | | | |
|---|---|---|---|---|
| 4,700,124 | A * | 10/1987 | Anderson | G05F 1/613 323/225 |
| 5,196,739 | A * | 3/1993 | Sandhu | H03K 17/063 327/536 |
| 2015/0188545 | A1* | 7/2015 | Gupta | H03K 19/1736 327/211 |
| 2018/0069552 | A1* | 3/2018 | Singh | H03K 19/0013 |

OTHER PUBLICATIONS

Texas Instruments Incorporated, "U.S. Patent Application," filed with the United States Patent and Trademark Office as U.S. Appl. No. 18/115,657 on Feb. 28, 2023, 46 pages.
Lizon et al., "Fundamentals of Precision ADC Noise Analysis," Texas Instruments e-book, ti.com/precisionADC, Sep. 2020, 67 pages.
Siddiqui, "Voltage to Time Converter based ADC," Department of Electronics and Nanoengineering Aalto University, School of Electrical Engineering, Apr. 29, 2020, 37 pages.

* cited by examiner

*Primary Examiner* — Peguy Jean Pierre
(74) *Attorney, Agent, or Firm* — Mandy Barsilai Fernandez; Frank D. Cimino

(57) ABSTRACT

An example apparatus includes programmable circuitry configured to: provide a sample signal, a time amplification (TA) signal, and a kick signal to sample and conversion circuitry; sample a differential signal for a first amount of time-based on the sample signal; charge a first capacitor for a second amount of time-based on the first kick signal; after the first amount of time and the second amount of time, charge a second capacitor, the charging based on the first TA signal, the charging to cause a falling edge in a first delay signal; and generating, a rising edge in the delay signal based on the falling edge of O_RST signal.

20 Claims, 9 Drawing Sheets

METHODS AND APPARATUS TO IMPROVE PERFORMANCE OF VOLTAGE TO DELAY CONVERTERS

TECHNICAL FIELD

This description relates generally to analog to digital converts (ADCs) and, more particularly, to methods and apparatus to improve performance of voltage to delay converters.

BACKGROUND

Information may be represented in computing devices as either a digital or analog signal. In many applications, information requires conversion from an analog signal to a digital signal. For example, an analog voltage is received over a transmission medium. The analog voltage may be transformed into a digital value. The digital value may be stored in a memory circuit, interpreted by processor circuitry, etc.

ADC circuits perform the conversion of analog voltages to digital values and are used in a variety of computing devices. In some examples, the analog to digital conversion can degrade the quality of information when converted from analog to digital form, causing information to be lost or distorted. Therefore, signal integrity may be used as a performance metric of an ADC circuit.

SUMMARY

For methods and apparatus to improve performance of voltage to delay converters, an example apparatus includes programmable circuitry configured to: provide a sample signal, a time amplification (TA) signal, and a kick signal to sample and conversion circuitry; sample a differential signal for a first amount of time-based on the sample signal; charge a first capacitor for a second amount of time-based on the first kick signal; after the first amount of time and the second amount of time, charge a second capacitor, the charging based on the first TA signal, the charging to cause a rising edge in a first delay signal; and generating a falling edge in the delay signal based on the falling edge of the output reset signal.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
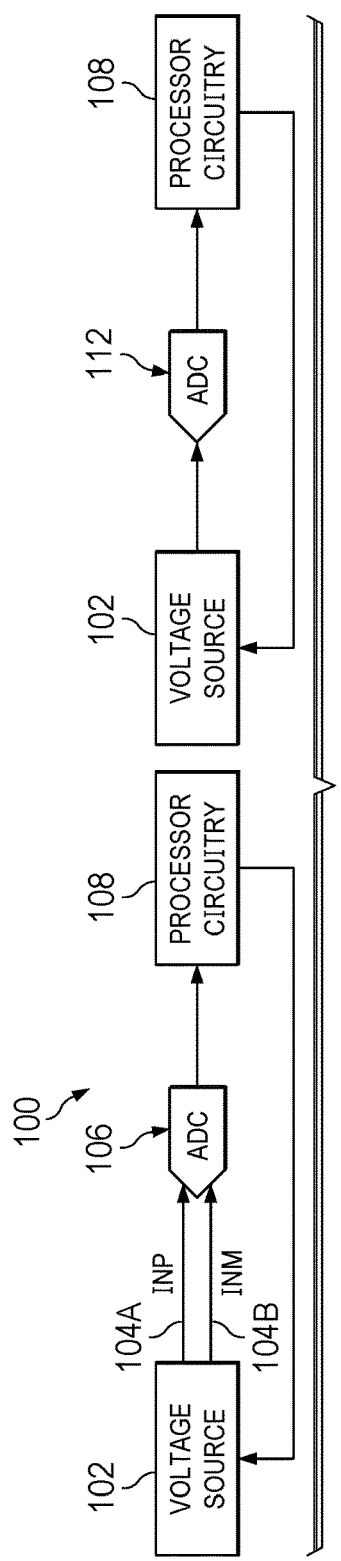
FIG. 1 is a block diagram of an example implementation of a compute environment.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

A wide variety of architectures are used throughout industry to implement ADC circuits. Designers or manufacturers of an electronic device may choose an ADC based on factors that include but are not limited to: cost of implementation, the size, speed, precision, and/or accuracy of the ADC circuit, system-level requirements of the electronic device, etc. One category of ADC architectures are time-based ADCs. In one such architecture, a time-based ADC may include a voltage to delay (VTD) converter and a delay to digital (DTD) converter. In some examples, a voltage to delay converter is referred to as a voltage to time converter (VTC), and a delay to digital converter is referred to as a time to digital converter (TDC).

In general, a VTD converter operates by converting an analog input voltage signal into a delay signal that is proportional to the input voltage. The DTD converter then converts the delay signal into digital data based on the proportionality. VTD converters and DTD converters are described further in connection with FIG. 2.

Some VTD converters may be implemented by one of two architectures. One such architecture is a current starved inverter. A current starved inverter may include a CMOS inverter and additional transistors that can "starve" (i.e., limit) a driving branch of the inverter when the output of the inverter transitions from a high supply voltage (e.g., a logical '1') to a low supply voltage e.g., a logical '0'). As a result, the amount of time required for a current starved inverter to fall from a high supply voltage to low supply voltage (e.g., the fall time) is proportional to the value of the analog input voltage signal. Current starved inverter architectures are used because they enable high bandwidth conversion. However, the sampling instance in current starved inverters is strongly modulated by the original input signal, which results in a nonlinear response and a poor spurious free dynamic range (SDFR). Furthermore, longer fall times in current starved inverters lead to additional noise from VTD converters and further decreases the overall signal to noise ratio (SNR) in time-based ADCs.

Another VTD architecture is a ramp and comparator circuit. A ramp and comparator circuit charges a capacitor using a predetermined ramp signal and compares the ramp signal with the sampled and held analog input signal. The ramp and comparator circuit produces an output responsive to the capacitor voltage crossing a threshold voltage determined by the sampled and held analog input signal. To do so, ramp and comparator circuits include a reset period in between samples of the input signal. In some examples, a ramp and comparator circuit is preceded by a sample and hold circuit. The reset period takes up time that would otherwise be used for additional samples and conversions. However, without a reset period, bandwidth of sample and hold circuits are limited by past signal memory. Furthermore, the delay signal generate by ramp and comparator circuits is not large enough for high speed operations due to a lack of time caused by the reset period. As a result, ramp and comparator circuits suffer from a nonlinear response and can lower the SNR of an ADC.

In some applications, the SNR of a time-based ADC can be improved through noise scaling. While various noise scaling architectures exist, any technique to improve SNR also introduces additional input capacitance to the ADC. The frequency response of such an input resistance (e.g., input resistance from a matching network) and input capacitance, in turn, may limit the bandwidth. As a result, other solutions to implement VTD circuits are limited in overall quality due to a trade-off between SNR and bandwidth (i.e., one metric cannot be increased without decreasing the other).

U.S. patent application Ser. No. 18/115,657 describes alternative VTD circuitry that breaks the trade-off between SNR and bandwidth by implementing multiple instances of a duplicated architecture. Each instance of the duplicated architecture includes one integrator and one inverter. In U.S. patent application Ser. No. 18/115,657, the small period of time for the integrator to sample the input signal enables current sharing amongst each instance of the duplicated architecture in the circuit, resulting in the alternative VTD circuitry taking multiple samples of the analog input signal during a single window of time. The additional samples from the multiple instances of the duplicated architecture further increase the sample rate above the Nyquist frequency, resulting in the alternative VTD circuitry achieving a higher SNR than other solutions. U.S. patent application Ser. No. 18/115,657, which is assigned to the assignee of the instant application, is hereby incorporated herein by reference in its entirety.

Although VTD circuits with multiple instances of a duplicated architecture (such as the alternative VTD circuit described above) provide improvements to SNR and bandwidth, such VTD circuits, further enhancements may be beneficial. For example, the linearity of the alternative VTD circuit is determined by: (a) the common mode current, and (b) the Drain voltage (VDS), experienced by the input transistor that connects each instance of the duplicated architecture together. As used herein, linearity refers to a quantitative measure of how directly proportional the VTD output (e.g., a delay signal) is to the VTD input (e.g., an analog voltage). Common mode and VDS are inversely related to one another in such an architecture, which impacts the linearity of the alternative VTD circuit. Accordingly, increasing common mode current through the input transistor reduces VDS across the input transistor and eventually degrades linearity of the input transistor. Also, decreasing common mode current increases sampling transistor's nonlinearity. In some examples, the noise caused by sampling transistor is referred to as jitter noise.

In the alternative VTD circuitry, the integrator, inverter, and a capacitor share a common terminal (e.g., are connected to the same node) in each of the duplicated architecture instances. As used herein, a conversion cycle refers to a sampling period, a VTD period, and a reset period that occur within a duplicated architecture instance. A conversion cycle in the alternative VTD circuitry begins with the common terminal in each duplicated architecture instance at a high supply voltage. However, the VTD period within the conversion cycle occurs when the voltage of the terminal is decreasing. Accordingly, the reset period at the end of each conversion cycle is lengthened to recharge the capacitor and increase the voltage measured at the common terminal. As such, the speed at which the alternative VTD circuit can convert a sampled voltage into a delay signal is impacted by the reset period.

Example methods, apparatus, and systems described herein provide for a new VTD circuit architecture with multiple instances of a duplicated architecture. Within each duplicated instance, the new VTD circuitry includes, among other components, an integrator, a gated inverter, and two capacitors connected to one another by a first terminal. The components of the new VTD circuitry described herein are configured, configurable, and or operable such that the VTD conversion to occur when the voltage at the first terminal increases, thereby moving the voltage of the first terminal closer to the reset value that starts the conversion cycle. Duplicated architecture instances in the new VTD circuitry described herein can receive an example kick signal that both: (a) facilitates that the VDS across an input transistor is high enough during the sampling period to improve linearity from the input transistor; and (b) lowers the voltage of the first terminal to a value, before the VTD operation begins, that improves both gain, power consumption, and linearity. This in turn increases the voltage to delay gain.

Advantageously, the kick signal described herein also improves the load capacitor requirement. A significant portion of the common mode current of the input transistor is provided by a kick capacitor, thereby lowering the effective capacitor requirements of the other circuit elements. The lower effective capacitor requirements enable a large voltage swing at the first terminal, which improves noise. Duplicated architecture instances in the new VTD circuitry described herein also receive a reset signal that prevents the inverter from triggering during the sampling period (e.g., the window of time in which the kick signal causes the first terminal to cross a threshold voltage that would otherwise trigger the inverter). Accordingly, the new VTD circuitry described herein exhibits improved SNR and linearity over some other solutions and also improves the speed and power consumption these other solutions. In some examples, the new VTD circuitry described herein supports use cases that require >18 Giga Hertz (GHz) input bandwidth while simultaneously scanning an input signal with a frequency that varies between 0 to 40 GHZ.

FIG. 1 is a block diagram of an example implementation of a compute environment. The compute environment 100 of FIG. 1 includes a voltage source 102, input signals 104A, 104B, ADC circuitry 106, processor circuitry 108, and ADC circuitry 112.

The voltage source 102 generates the input signals 104A, 104B. The voltage source 102 may be implemented as any type of device and may generate the input signals 104A, 104B for any purpose. For example, the voltage source 102 may be sensor circuitry that generates the input signals 104A, 104B to perform a measurement. In another example, the voltage source 102 is transceiver circuitry that generates the input signals 104A, 104B in response to receiving data over a transmission medium (e.g., a cell network, a cable, etc.). In some examples, the input signals 104A, 104B change over time.

The input signals 104A, 104B are analog voltage signals that collectively contain information conveyed by the voltage source 102. In particular, the input signal 104A is a positive differential signal, and the input signal 104B is a negative differential signal. In examples described herein, the voltage source 102 generates the input signals 104A, 104B rather than a single-ended signal so that the embedded information is less susceptible to noise during transmission. In other examples, the voltage source 102 generates a single-ended signal having one output instead of a differential signal having two outputs. In such examples, the single-ended signal is interpretable by the ADC circuitry 112. In some examples, the input signal 104A is referred to as an input positive (INP) signal, and the input signal 104B is referred to as an input negative (INM) signal.

The ADC circuitry 106 converts the input signals 104A, 104B into digital values (i.e., '0' and '1' bits) representative of the information in the analog voltages. In particular, the output of the ADC circuitry 106 is a digital signal which includes a high supply voltage for a logical '1' bit and a low supply voltage for a logical '0' bit. The ADC circuitry 106 is described further in connection with FIG. 2.

The processor circuitry 108 obtains the digital bits from the ADC circuitry 106 and may perform operations based on the digital bits. For example, the digital bits may represent sensor readings, and the processor circuitry 108 may perform operations by presenting the readings to a user on a display. The processor circuitry 108 may be implemented by any type of processor device. Examples of processor devices include programmable microprocessors, Field Programmable Gate Arrays (FPGAs) that may instantiate instructions, Central Processor Units (CPUs), Graphics Processor Units (GPUs), Digital Signal Processors (DSPs), or microcontrollers and integrated circuits such as Application Specific Integrated Circuits (ASICs).

In another example, the digital bits represent a message from the voltage source 102, and the processor circuitry 108 performs operations by sending a reply message to the voltage source 102. For instance, suppose the voltage source 102 is a portable speaker, the ADC circuitry 106 and processor circuitry 108 are implemented in a mobile phone, the input signals 104A, 104B include a pairing message from the portable speaker, and that the mobile phone uses a Bluetooth® protocol to receive the input signals 104A, 104B over a wireless transmission medium. In such an example, the processor circuitry 108 may receive the pairing message from the portable speaker and transmit a Bluetooth® compatible handshake message over the wireless medium in response, thereby beginning the process that pairs the portable speaker to the phone.

The compute environment 100 may include additional elements not illustrated in FIG. 1 in order to facilitate the transmission of the input signals 104A, 104B, the encoding of the input signals to digital bits, and the performance of operations based on the digital bits. These additional elements may include, but are not limited to, power supplies, memory circuitry, interface circuitry, etc.

Figure 2:
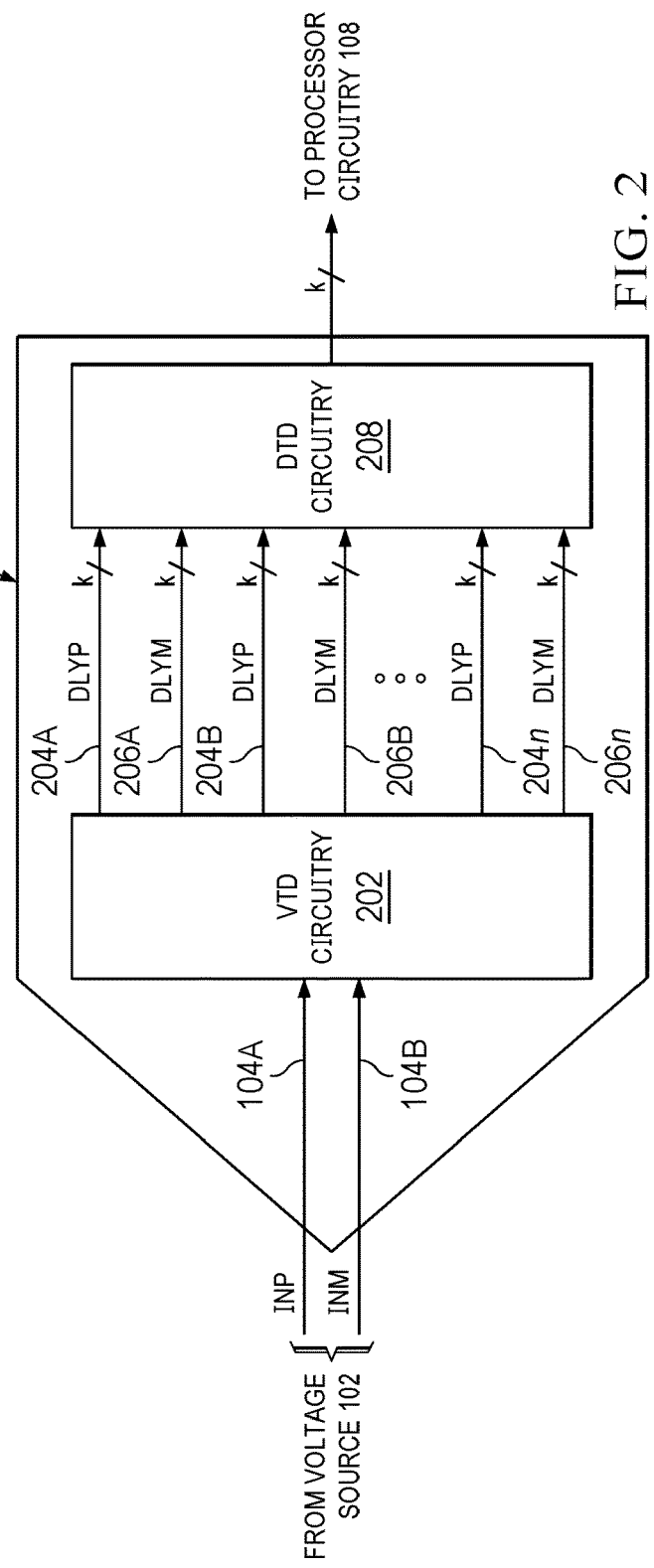
FIG. 2 is a block diagram of an example implementation of the ADC circuitry of FIG. 1.

FIG. 2 is a block diagram of an example implementation of the ADC circuitry 106 of FIG. 1. The ADC circuitry 106 of FIG. 2 includes VTD circuitry 202, delay positive (DLYP) signals 204A, 204B . . . 204n, delay minus (DLYM) signals 206A, 206B, . . . , 206n, and DTD circuitry 208.

The VTD circuitry 202 obtains the input signals 104A, 104B from the voltage source 102 and outputs delay signals according to the teachings described herein. The VTD circuitry 202 produces n signals (e.g., the DLYP signals 204A, 204B, . . . 204n) based on the positive portion of the differential signal (e.g., input signal 104A). The VTD circuitry 202 produces an additional n signals (e.g., the DLYM signals 206A, 206B . . . 206n) based on the negative portion of the differential signal (e.g., input signal 104B). As used herein, the variable n refers to the number of instances of the duplicated architecture within the VTD circuitry 202. The duplicated architecture of the VTD circuitry 202 is described further in connection with FIGS. 4 and 5.

The DTD circuitry 208 obtains the delay signals generated by the VTD circuitry 202 and converts the delay signals into digital bits. The DTD circuitry 208 determines the value of the digital bits based on and/or responsive to a comparison of two corresponding delay signals (e.g., DLYP signal 204A and DLYM signal 206A). The comparison of two corresponding delay signals is described further in connection with FIG. 7.

The VTD circuitry 202 produces delay signals that, when interpreted by the DTD circuitry 208, produce k bits of information within a given sample of the INP signal 104A and INM signal 104B. Because the DLYP signals 204A, 204B . . . 204n and the DLYM signals 206A, 206B . . . 206n are differential signals, a pair of two corresponding delay signals collectively correspond to k bits of information in each sample. In some examples, the k bits corresponding to a sample are referred to as a symbol. A given instance of the duplicated architecture in the VTD circuitry 202 can produce symbols at a certain rate (e.g., 8 giga symbols per second (GSPS)). Furthermore, because there are n instances of the duplicated architecture in the VTD circuitry 202, the VTD circuitry 202 transmits k bits information at a rate that is n times larger than the rate of an individual instance. For instance, if a given instance of the duplicated architecture produces k-bit wide symbols at 8 GSPS and n=4, the overall transmission rate from the VTD circuitry 202 to the DTD circuitry 208 is 32 GSPS at k bits per symbol.

The n instances of the duplicated architecture in the VTD circuitry 202 respectively sample the same portion of the INP signal 104A and INM signal 104B. Accordingly, if the VTD circuitry 202 did not exhibit any error, then the DLYP signal 204A, 204B . . . 204n signals would have identical waveforms, the DLYM signal 206A, 206B . . . 206n signals would have identical waveforms, and the k bits that correspond to DLYP signal 204A and DLYM signal 206A would be equal to the k bits that correspond to DLYP signal 204B and DLYM signal 206B. However, differences in the electrical components of the VTD circuitry 202 may result in differences between waveforms of delay signals. Accordingly, the k bits generated from one set of delay signals may have a different value than the k bits made from another set of delay signals responsive to the error.

Advantageously, the DTD circuitry 208 uses digital filtering techniques to down sample such that the rate of digital bits provided to the processor circuitry matches the original data rate in the input signals 104A, 104B (e.g., 8 GSPS at k bits per symbol). The duplicated architecture of the VTD circuitry 202 enables the DTD circuitry 208 to filter and down sample the incoming delay signals, which improves the SNR of the ADC circuitry 106. Furthermore, the VTD circuitry 202 described herein is implemented by circuitry that improves speed and linearity compared to some other VTD circuits with multiple instances of a duplicated architecture.

Figure 3:
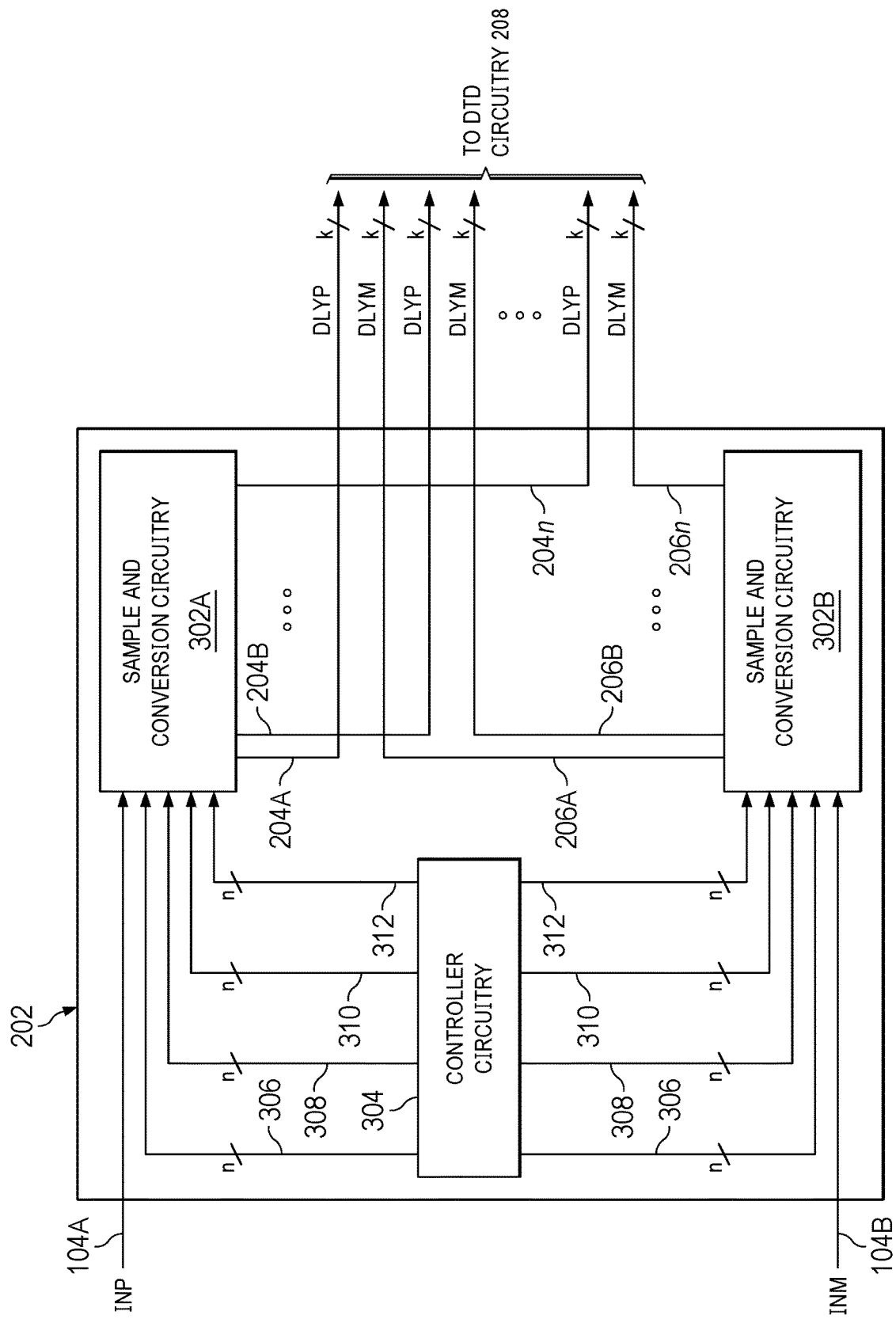
FIG. 3 is a block diagram of an example implementation of the voltage to delay (VTD) circuitry of FIG. 2.

FIG. 3 is a block diagram of an example implementation of the VTD circuitry 202 of FIG. 2. The VTD circuitry 202 of FIG. 3 includes sample and conversion circuitry 302A, 302B, controller circuitry 304, sample signals 306A, 306B . . . , 306n (shown collectively in FIG. 3 as sample signals 306), time amplification (TA) signals 308A, 308B, . . . , 308n (shown collectively in FIG. 3 as TA signals 308), kick signals 310A, 310B, . . . , 310n (shown collectively in FIG. 3 as kick signals 310), and output reset signals 312A, 312B, . . . 312n (shown collectively in FIG. 3 as output reset signals 312).

The sample and conversion circuitry 302A obtains the input signal 104A and generates the DLYP signals 204A, 204B, . . . , 204n based on the positive portion of the differential input signal. To produce the DLYP signals 204A, 204B . . . , 204n, the sample and conversion circuitry 302A includes n instances of the duplicated architecture that perform operations responsive to the controller circuitry 304. In particular, a given instance of the duplicated architecture obtains one sample signal (e.g., sample signal 306A), one TA signal (e.g., TA signal 308A), one kick signal (e.g., kick signal 310A), and one output reset signal (e.g., output reset signal 312A).

Similarly, the sample and conversion circuitry 302B obtains the input signal 104B and generates the DLYM signals 206A, 206B . . . 206n based on the negative portion of the differential input signal. The sample and conversion circuitry 302B is a mirrored version of the sample and conversion circuitry 302A in the sense that the sample and conversion circuitry 302B also includes n instances of the duplicated architecture that perform operations based on the controller circuitry 304. In particular, a given instance of the duplicated architecture obtains one sample signal (e.g., sample signal 306A), one TA signal (e.g., TA signal 308A) one kick signal (e.g., kick signal 310A), and one output reset signal (e.g., output reset signal 312A). In some examples, the sample and conversion circuitry 302A is referred to as a first half circuit and the sample and conversion circuitry 302B is referred to as a second half circuit.

The controller circuitry 304 generates the sample signals 306, the TA signals 308, the kick signals 310, and the output reset signals 312. The controller circuitry 304 provides these signals to both the signal and conversion circuitry 302A and the signal and conversion circuitry 302B. In doing so, the controller circuitry 304 coordinates the timing in which the n instances of the duplicated architectures sample the input signals 104A, 104B, discharge a terminal within the duplicated architecture, and produce a pulse (e.g., an approximately rectangular waveform) in the output delay signal. The sample signals 306, the TA signals 308, the kick signals 310, and the output reset signals 312 are described further in connection with FIG. 4.

In some examples, the controller circuitry 304 can generate the sample signals 306, the TA signals 308, the kick signals 310, and the output reset signals 312 in a manner that results in a specific performance profile. The controller circuitry 304 may be configured for any reason, including but not limited to cost, speed, accuracy, precision, system-level requirements of devices within the compute environment 100, etc. The controller circuitry 304 may be implemented by devices that include but are not limited to one or more integrated circuits, logic circuits, FPGAs, ASICs, etc.

Figure 4:
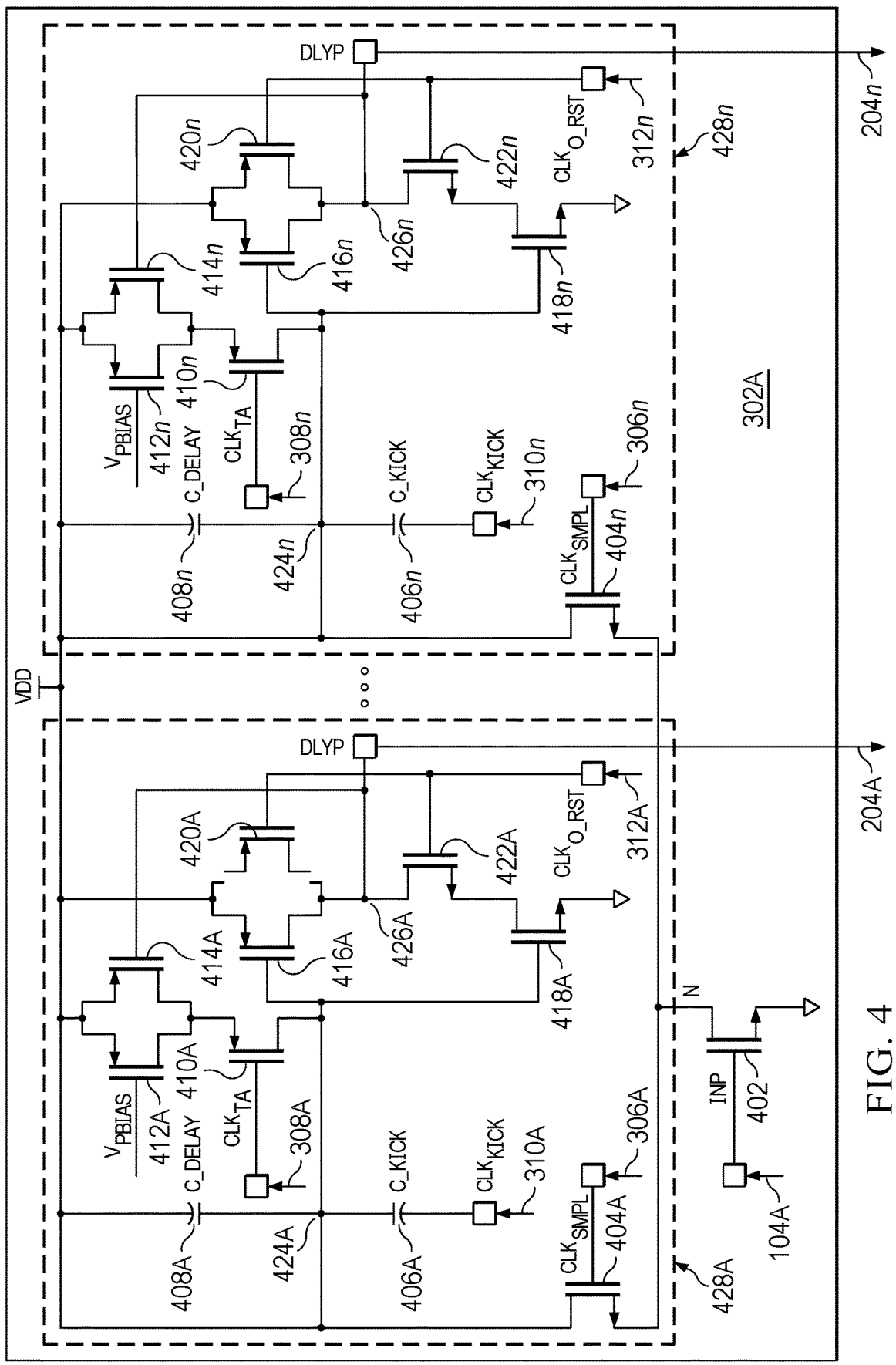
FIG. 4 is a schematic diagram of a first example implementation of the sample and conversion circuitry of FIG. 3.

FIG. 4 is a schematic diagram of a first example implementation of the sample and conversion circuitry 302A of FIG. 3. The example of FIG. 4 includes a first transistor 402, second transistors 404A, 404B, . . . 404n, first capacitors 406A, 406B, . . . , 406n, second capacitors 408A, 408B, . . . 408n, third transistors 410A, 410B, . . . 410n, fourth transistors 412A, 412B . . . 412n, fifth transistors 414A, 414B . . . 414n, sixth transistors 416A, 416B . . . 416n, seventh transistors 418A, 418B, . . . , 418n, eighth transistors 420A, 420B, . . . , 420n, ninth transistors 422A, 422B . . . , 422n, first terminals 424A, 424B, . . . 424n, second terminals 426A, 426B . . . 426n, and duplicated architecture instances 428A, 428B, . . . , 428n.

A given instance of the duplicated architecture (e.g., 428A) is implemented by circuit elements including: one instance of the second transistor (e.g., 404A), one instance of the first capacitor (e.g., 406A), one instance of the second capacitor (e.g., 408A), one instance of the third transistor (e.g., 410A), one instance of the fourth transistor (e.g., 412A), one instance of the fifth transistor (e.g., 414A), one instance of the sixth transistor (e.g., 416A), one instance of the seventh transistor (e.g., 418A), one instance of the eighth transistor (e.g., 420A), and one instance of the ninth transistor (e.g., 422A). The duplicated architecture instances 428A, 428B, . . . , 428n are referred to as duplicates as a given duplicated architecture instance 428A includes the same components and same connections as another duplicated architecture instance 428n.

The first transistor 402 has a first gate that can receive the input signal 104A, a first source that is coupled to ground, and a first drain. In the example of FIG. 4, the first transistor 402 is a p-channel metal oxide semiconductor (PMOS) transistor. In other examples, the first transistor 402 is implemented using a different transistor architecture.

Within the duplicated architecture instance 428A, the second transistor 404A has a second gate that can receive the sample signal 306A from the controller circuitry 304, a second source that is coupled to the first drain of the first transistor 402, and a second drain that can receive a supply voltage. The supply voltage may be any voltage used to represent a logical '1' in the DLYP signals 204A, 204B . . . , 204n. The supply voltage may be provided by any suitable device (e.g., a power supply in the compute environment 100). In the example of FIG. 4, supply voltage is labelled as Voltage Drain Drain (VDD) and the second transistor 404A is a NMOS transistor. In other examples, the supply voltage is labelled differently and/or the second transistor 404A is implemented using a different transistor architecture.

Within the duplicated architecture instance 428A, the first capacitor 406A has a positive terminal coupled to the first terminal 424A and a negative terminal to receive the kick signal 310A. The first capacitor 406A may be implemented with any capacitance. In some examples, a designer or manufacturer selects the capacitance value based on factors such as cost, size, a desired performance profile of the example ADC circuitry 106, etc. The kick signals 310 are described further in connection with FIG. 7.

Within the duplicated architecture instance 428A, the second capacitor 408A has a positive terminal coupled to the first terminal 424A and a negative terminal to receive the supply voltage. The second capacitor 408A may be implemented with any capacitance. In some examples, a designer or manufacturer selects the capacitance value based on factors such as cost, size, a desired performance profile of the example ADC circuitry 106, etc.

Within the duplicated architecture instance 428A, the third transistor 410A has a third gate that can receive the TA signal 308A from the controller circuitry 304, a fourth source, and a fourth drain that is coupled to the first terminal 424A. In the example of FIG. 4, the third transistor 410A is a p-channel metal oxide semiconductor (PMOS) transistor. In other examples, the fourth transistor 410 is implemented using a different transistor architecture.

Within the duplicated architecture instance 428A, the fourth transistor 412A has a fourth gate that can receive a bias voltage, a fourth source that can receive the supply voltage, and a fourth drain that is coupled to the third source of the third transistor 410A. The bias voltage is used to control the gain of the voltage to time conversion operations. The bias voltage may be provided by any suitable device (e.g., a power supply in the compute environment 100). In the example of FIG. 4, the fourth transistor 412A is a PMOS transistor. In other examples, the fourth transistor 412A is implemented using a different transistor architecture.

Within the duplicated architecture instance 428A, the fifth transistor 414A has a fifth gate that is coupled to the second terminal 426A, a fifth source that can receive the supply voltage, and a fifth drain that is coupled to the third source of the third transistor 410A. In the example of FIG. 4, the fifth transistor 414A is a PMOS transistor. In other examples, the fifth transistor 414A is implemented using a different transistor architecture.

Within the duplicated architecture instance 428A, the sixth transistor 416A has a sixth gate that is coupled to the first terminal 424A, a sixth source that can receive the supply voltage, and a sixth drain that is coupled to the second terminal 426A. The voltage measured at the second terminal 426A is referred to as the DLYP signal 204A and is provided to the DTD circuitry 208.

Within the duplicated architecture instance 428A, the seventh transistor 418A has a seventh gate that is coupled to the first terminal 424A, a seventh source that is coupled to ground, and a seventh drain. In the example of FIG. 4, the seventh transistor 418A is a NMOS transistor. In other examples, the seventh transistor 418A is implemented using a different transistor architecture.

Within the duplicated architecture instance 428A, the eighth transistor 420A has an eighth gate that can receive the output reset signal 312A from the controller circuitry 304, an eighth source that can receive the supply voltage, and an eighth drain that is connected to the second terminal 426A. In the example of FIG. 4, the eighth transistor 420A is a PMOS transistor. In other examples, the eighth transistor 420A is implemented using a different transistor architecture.

Within the duplicated architecture instance 428A, the ninth transistor 422A has a ninth gate that can receive the output reset signal 312A from the controller circuitry 304, a ninth source that is coupled to the seventh drain of the seventh transistor 418A. In the example of FIG. 4, the ninth transistor 422A is a NMOS transistor. In other examples, the ninth transistor 422A is implemented using a different transistor architecture.

In the example of FIG. 4, the first transistor 402, combines with the second transistors 404A, 404B . . . , 404n to form n sets of integrators. Specifically, a given duplicated architecture instance 428A includes one integrator that includes the first transistor 402 and a corresponding second transistor 404A. The sample signals 306 include pulses that, when received by the n instances of the duplicated architectures, cause the n sets of the integrators to sample the input signal 104A in an interleaved fashion. Accordingly, the controller circuitry 304 synchronizes the sample signals 306, the TA signals 308, the kick signals 310, and the output reset signals 312 such that a second sample pulse (e.g., a pulse from sample signal 306B, sent to duplicated architecture instance 428B) occurs during the same time that the duplicated architecture instance 428A is converting the input voltage captured during a first sample pulse (from sample signal 306A) into a delay signal.

When the duplicated architecture instance 428A receives a corresponding sample signal 306A, the integrator samples the input signal 104A, which decreases the voltage exhibited at the first terminal 424A by discharging the second capacitor 408A. In some examples, the period of time when the sample signal 306A is at a high supply voltage is referred to as a sample period or an integration period.

In the example of FIG. 4, the sixth transistors 416A, 416B . . . , 416n, combine with the seventh transistors 418A, 418B . . . , 418n to form n sets of inverters. A given duplicated architecture instance 428A includes one inverter that includes a sixth transistor 416A and a seventh transistor 418A. During the sample period, the discharge of the second capacitor 408A causes the voltage at the first terminal 424A to cross a threshold value that would normally cause the inverter of the duplicated architecture instance 428A to activate (e.g., current would flow through the sixth transistor 416A and seventh transistor 418A), thereby increasing the voltage at the first terminal 424A. However, the activation of the inverter and subsequent increase of the voltage at the first terminal 424A is designed to occur at the end of the conversion cycle to reset the sample and conversion circuitry 302A (as opposed to the sample period, which occurs at the beginning of the conversion cycle).

Advantageously, the sample and conversion circuitry 302A includes the eighth transistor 420A and the ninth transistor 422A to prevent the inverter from activating until the end of the conversion cycle. The eighth transistor 420A and the ninth transistor 422A collectively form an activation controller for the inverter that is operated by the controller circuitry 304 via the output reset signal 312A. When the controller circuitry 304 sets the output reset signal 312A to a low voltage, the inverter activation controller temporarily prevents the inverter from activating. In some examples, the inverter is referred to as enabled when the inverter activation controller permits the inverter to activate at the voltage threshold. Similarly, in some examples, the inverter is referred to as disabled when the inverter activation controller prevents the inverter from activating.

The ability to temporarily disable the inverter allows the sample and conversion circuitry 302A to be configured such that the inverter is triggered near the high supply voltage rather than the low supply voltage. As such, the voltage to delay period and the reset period of the conversion cycle both occur while the voltage of the first terminal 424A increases. Accordingly, the voltage to delay period and the reset period are overlapped in time. Thus, the VTD circuitry 202 described herein can complete a conversion cycle faster than some other VTD circuits.

Figure 5:
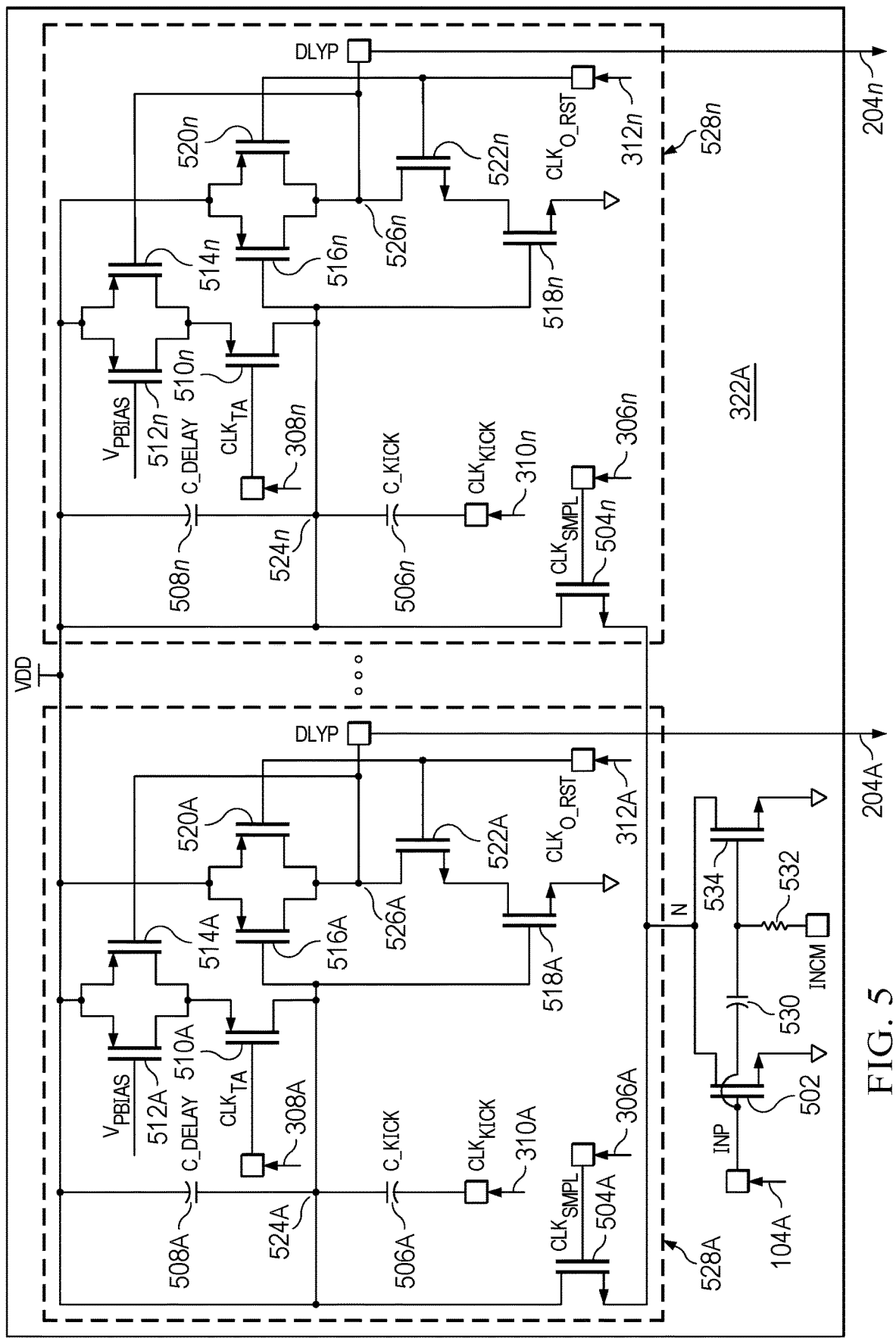
FIG. 5 is a schematic diagram of a second example implementation of the sample and conversion circuitry of FIG. 3.

FIG. 5 is a schematic diagram of a second example implementation of the sample and conversion circuitry of FIG. 3. The example block diagram of FIG. 5 includes sample and conversion circuitry 322A, a first transistor 502, second transistors 504A, 504B . . . , 504n, first capacitors 506A, 506B . . . , 506n, second capacitors 508A, 508B . . . , 508n, third transistors 510A, 510B . . . , 510n, fourth transistors 512A, 512B . . . , 512n, fifth transistors 514A, 514B . . . 514n, sixth transistors 516A, 516B . . . 516n, seventh transistors 518A, 518B, . . . , 518n, eighth transistors 520A, 520B . . . , 520n, ninth transistors 522A, 522B, . . . 522n, first terminals 524A, 524B . . . , 524n, second terminals 526A, 526B, . . . , 526n, and duplicated architecture instances 528A, 528B . . . 528n, a third capacitor 530, a resistor 532, and a tenth transistor 534.

The sample and conversion circuitry 322A is an alternative implementation of the sample and conversion circuitry 302A. Accordingly, in some examples, the VTD circuitry 202 of FIG. 2 can be implemented with the sample and conversion circuitry 322A rather than the sample and conversion circuitry 302A. In such examples, the VTD circuitry 202 of FIG. 2 would be implemented with the sample and conversion circuitry 322B (a mirrored version of the circuit diagram illustrated in FIG. 5) rather than the sample and conversion circuitry 302B.

Within the sample and conversion circuitry 322A, the third capacitor 530 has a negative terminal coupled to the gate of the example first transistor 502 and a positive terminal. The resistor 532 has a first terminal coupled to the positive terminal of the second capacitor 524, and a second terminal coupled to an input common mode (INCM) signal. The INCM signal is a biasing signal used by the tenth transistor 534. The INCM signal may be provided by any suitable device (e.g., a power supply in the compute environment 100). The tenth transistor 534 has a tenth gate coupled to the positive terminal of the third capacitor 530, a tenth source coupled to ground, and a tenth drain coupled to the drain of the first transistor 502. In the example of FIG. 5, the tenth transistor 534 is a NMOS transistor. In other examples, the tenth transistor 534 is implemented using a different transistor architecture.

The sample and conversion circuitry 322A of FIG. 5 includes n duplicated architecture instances 528A, 528B . . . 528n that include the same electrical components, include the same couplings between components, include the same control signals, and perform the same functions as the n duplicated architecture instances 428A, 428B . . . , 428n of FIG. 4. However, the sample and conversion circuitry 322A of FIG. 5 also includes the third capacitor 530, the resistor 532, and the tenth transistor 534, but FIG. 4 does not include these components. The components form a high pass filter that provides a stable SNR across a wide band of sampling frequencies.

While the use of the duplicated architecture instances 528A, 528B . . . , 528n generally increase both SNR and bandwidth when compared to previous VTD circuits, the use of the high pass filter provides fine grain programmability between SNR and bandwidth metrics. For example, both: (1) the voltage of the INCM signal that is applied to a terminal of the resistor 532, and (2) the width of the pulses in the sample signals 306, may be tuned (e.g., selected) together. In some examples, the width of the sample signals 306 is increased, and the voltage of the INCM signal is decreased, to achieve higher SNR at the expense of a lower bandwidth. In alternative examples, the voltage of the INCM signal is increased, and the width of the sample signals 306 is decreased, to achieve a higher bandwidth at the expense of a lower SNR.

Because the sample and conversion circuitry 322B referenced above is a mirrored version of the sample and conversion circuitry 302A, the sample and conversion circuitry 322B may be implemented using the same electrical components, couplings, and control signals illustrated in FIG. 5. However, the sample and conversion circuitry 322B samples the input signal 104B to produce DLYM signals 206A, 206B . . . , 206n, and the sample and conversion circuitry 322A samples the input signal 104A to produce DLYP signals 204A, 204B, . . . , 204n.

Figure 6:
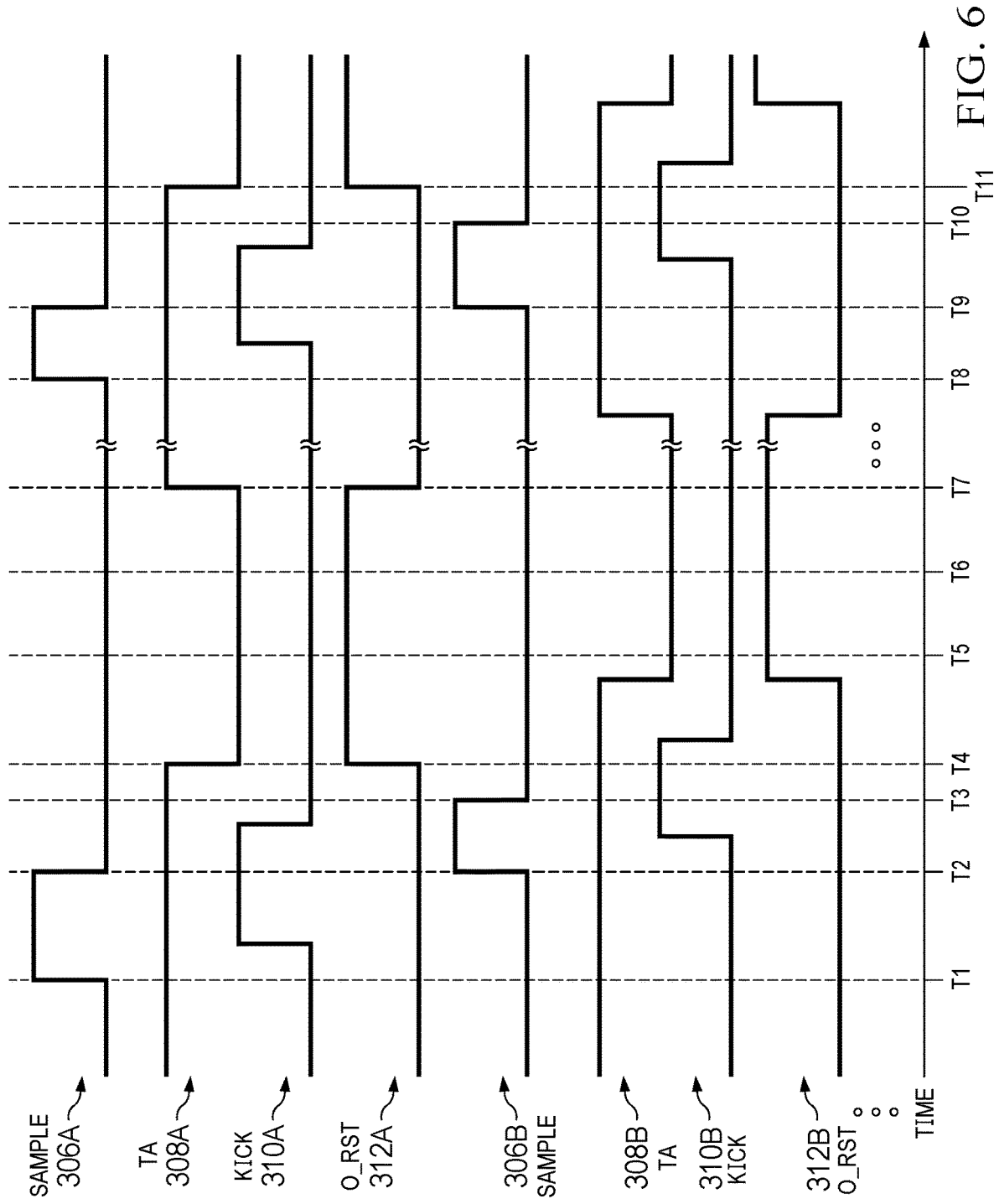
FIG. 6 is an example timing diagram of signals sent by the controller circuitry of FIG. 3.

FIG. 6 is an example timing diagram of signals sent by the controller circuitry of FIG. 3. FIG. 6 includes the sample signals 306, the TA signals 308, the kick signals 310, and the output reset signals 312 sent to the sample and conversion circuitry 302A on a timeline. The timeline of FIG. 6 is ordered chronologically such that T1 occurs before T2, T2 occurs before T3, etc.

Within the duplicated architecture instance 428A of sample and conversion circuitry 302A, the sample signal 306A, the TA signal 308A, the kick signal 310A, and the output reset signal 312A control the sequence of operations. For example, at T1, the controller circuitry 304 transmits the rising edge of a pulse in the sample signal 306A, causing the integrator (that includes the first transistor 402 and the second transistor 404A) to sample the input signal 104A. The sample/integration period of the duplicated architecture instance 428A lasts until T2, when the controller circuitry 304 transmits a falling edge of the pulse in the sample signal 306A.

The controller circuitry 304 sends a rising pulse edge in the kick signal 310A after T1 and before T2. Accordingly, the kick signal 310A provides a kick voltage (e.g., a high supply voltage) to the first capacitor 406A during the sample period. The high supply voltage provided in the sample signal 306A, the high supply voltage provided in the TA signal 308A, the high supply voltage provided in the kick signal 310A, the high supply voltage provided in the output reset signal 312A, and the supply voltage displayed in FIGS. 4 and 5 (e.g., VDD) may refer to different values. In some examples, a designer or manufacturer determines a value for each of the foregoing high supply voltages based on an available power supply, the type of transistors used, etc., to achieve the functionality described herein.

The high supply voltage of the kick signal 310A charges the first capacitor 406A and slows the rate at which the voltage at the first terminal 424A decreases. The controller circuitry 304 sends the falling pulse edge in the kick signal 310A after T2 and before T4. The transition in the kick signal 310A causes the voltage at the first terminal 424A to decrease past the threshold voltage of the inverter (e.g., the sixth transistor 416A and the seventh transistor 418A). The example of FIG. 6 presents the kick signal as a rectangular waveform. In other examples, the controller circuitry 304 implements the kick signals 310 as a sawtooth waveform or another type of waveform.

The controller circuitry 304 transitions the TA signal 308A to a low voltage at T4 (e.g., after the pulse in the kick signal 310A ends and the voltage of the first terminal 424A has subsequently decreased). The transition at T4 in the TA signal 308A causes the third transistor 410A to turn on, thereby causing the input voltage of the inverter to rise. The rate at which the input voltage of the inverter rises is determined by the fourth transistor 412A and the fifth transistor 414A. As a result, the conversion of the INP signal 104A to a delay signal (e.g., the VTD period) begins at T4. The conversion continues until T7, when the controller circuitry 304 transitions the TA signal 308A back to a high supply voltage.

In the example block diagrams of FIGS. 4 and 5, the eighth transistor 420A and the ninth transistor 422A are configured such that the INP signal 104A cannot activate the inverter when the output reset signal is at a low supply voltage. At T4, the controller circuitry 304 provides the rising edge of a pulse in the output reset signal 312A, thereby disabling the gate of the eighth transistor 420A and the ninth transistor 422A. Accordingly, the inverter is activated, and the reset period starts at T4. Furthermore, the second capacitor 408A discharges only once during a conversion cycle because the inverter was disabled before T4 (e.g., when the kick voltage caused the voltage of the first terminal 424 to cross the inverter threshold).

The activation of the inverter at T4 enables the inverter to trigger at T5, responsive to the voltage of the first terminal 424A in sample and conversion circuitry 302A crosses the threshold voltage. At T6, the voltage of the first terminal 424A in sample and conversion circuitry 302B also crosses the threshold voltage. The difference between T5 and T6 is the difference in time between a falling edge of DLYP signal 204A and a corresponding edge of the DLYM signal 206A. The DLYP signal 204A and the DLYM signal 206A are described further in connection with FIG. 7.

The controller circuitry 304 ends the VTD period, the reset period, and, more generally, the conversion cycle at T7. In particular, the controller circuitry 304 provides a falling edge of a pulse in the output reset signal 312A at T7, thereby re-enabling the gate of the eighth transistor 420A and the ninth transistor 422A. The controller circuitry 304 also provides a rising pulse edge in the TA signal 308A at T7.

Advantageously, the use of the output reset signal 312A enables the threshold voltage of the inverter to be closer to the reset voltage of first terminal 424A. The proximity between the threshold voltage of the inverter and the reset voltage of the first terminal 424A enables the VTD period and reset period to both occur while the voltage of the first terminal 424A increases. In turn, two portions of the conversion cycle overlap in time, and the VTD circuitry 202 described herein can complete a conversion cycle faster than some other VTD circuits.

Once the second transistor 404A turns off at T2, the controller circuitry 304 can perform the VTD period and the reset period described above independently from the operations of the duplicated architecture instances 428B, . . . , 428n. For example, the controller circuitry 304 sends a pulse in the sample signal 306B from T2 to T3, causing the duplicated architecture instance 428B to sample the signal while the duplicated architecture instance 428A is in the VTD period. Advantageously, because the time between T1 and T2, and the time between T2 and T3 (e.g., the width of a sample pulse) is shorter than sample periods of previous solutions, the VTD circuitry 202 can support n instances of the duplicated architecture, increasing SNR through oversampling.

In general, if x refers to an index of the sample signals 306, the controller circuitry 304 may transmit a rising edge of a pulse in the (x+1)th sample signal any amount of time after transmitting a falling edge of the pulse in the xth sample signal. After transmitting the falling edge of the sample signal 306n, each of the n duplicated architecture instances have sampled the same k bits of information present in the input signal. As a result, the controller circuitry 304 may transmit a rising edge in the sample signal 306A, beginning a sample of the next k bits of information from the duplicated architecture instance 428A, as soon as: (1) the falling edge of the of the sample signal 306n has been transmitted and (2) the reset period of the duplicated architecture instance 428A is complete. As an example, in FIG. 6, the conversion cycle of the duplicated architecture instance 428A ends at T7 and the conversion cycle of the duplicated architecture instance 428n ends before T8. Accordingly, the controller circuitry 304 causes the duplicated architecture instance 428A to begin another conversion cycle at T8 and an additional portion of the INP signal 104A is sampled. Accordingly, the controller circuitry 304: sends a pulse in the sample signal 306A from T8 to T9, sends a pulse in the sample signal 306B from T9 to T10, etc. The sample, conversion, and reset periods are described further in connection with FIG. 7.

Figure 7:
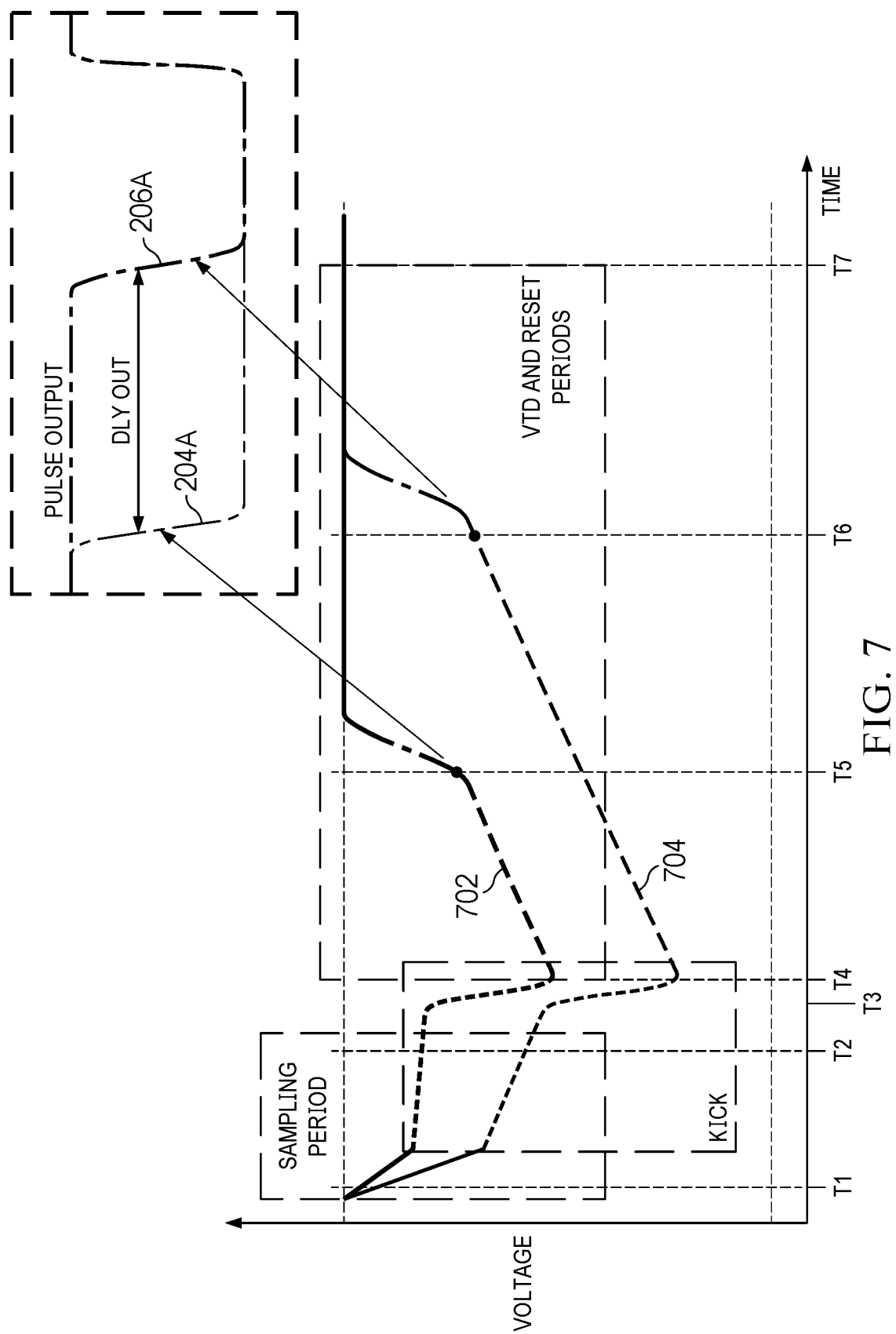
FIG. 7 is an example of a first delay signal and a second delay signal provided by the signal and conversion circuitry of FIG. 3.

FIG. 7 is an example of a first delay signal and a second delay signal provided by the signal and conversion circuitry of FIG. 3. In particular, FIG. 7 includes the DLYP signal 204A produced by the sample and conversion circuitry 302A and the DLYM signal 206A produced by the sample and conversion circuitry 302B. The example of FIG. 7 also includes signals 702 and 704.

The signal 702 refers to the voltage of the first terminal 424A from the sample and conversion circuitry 302A. As a result, the timing of changes in the signal 702 affect the value of the DLYP signal 204A. Similarly, the signal 704 refers to the voltage of the first terminal 424A from the sample and conversion circuitry 302B. As a result, the timing of changes in the signal 704 affect the value of the DLYM signal 206A. The signals 702, 704, are overlayed in FIG. 7 for comparison purposes. FIG. 7 also includes timestamps T1-T7, which refer to the same points in time as T1-T7 from FIG. 6.

At T1, the sample and conversion circuitry 302A begins to sample the input signal 104A and the sample and conversion circuitry 302B begins to sample the input signal 104B. Both sampling periods include a discharge in the second capacitor 408A, which leads to a corresponding decrease in the voltage of their first terminal 424A. However, because the input signal 104A is a different voltage than the input signal 104B, the voltages of the nodes decrease at different rates during the sample period. As a result, the voltage in the signal 702 is different from the voltage in the signal 704 when the sample period ends at T2.

In general, the decrease in voltage of the first terminal 424A during the sample period is beneficial because the lower voltage causes a higher gain in the VTD circuitry 202. In turn, a higher gain improves the SNR while reducing power consumption. However, without the kick signal 310A, the second capacitor 408A may be discharged fully during the sample period. A full discharge of the second capacitor 408A decreases the headroom available for the saturation margin of the first transistor 402, thereby increasing nonlinearity. As used herein, the headroom refers to the difference in voltage between the drain of the first transistor 402 and ground.

Advantageously, the kick signal 310A charges the first capacitor 406A during the sample period, which prevents the second capacitor 408A from fully discharging. Instead, at T4 (e.g., after the kick signal 310A is turned off and the first capacitor 406A has finished discharging), the voltage of the first terminal 424A decreases to a value that balances gain (which affects power consumption and speed) and headroom (which affects linearity). In some examples, a designer or manufacturer may configure the VTD circuitry 202 to exhibit specific performance metrics that are desired for a particular application.

The inverter that includes the sixth transistor 416A and the seventh transistor 418A is triggered by a threshold voltage. The voltage of the first terminal 424A crosses the threshold voltage of the inverter between T2 and T4. However, because the output reset signal 312A is still at a low supply voltage, the gate that includes the eighth transistor 420A and the ninth transistor 422A prevents the inverter from activating between T2 and T4.

At T2, the controller circuitry 304 ends the sample period by providing a falling pulse edge in the sample signal 306A. After the first capacitor 406A finishes discharging at T4, the controller circuitry 304 starts the VTD period at T4 by providing a falling pulse edge in the TA signal 308A. Accordingly, the supply voltage begins to pull the voltage of the first terminal 424A upwards at T4. The controller circuitry 304 also provides a rising pulse edge of the output reset signal 312A at T4, thereby disabling the gate, enabling the inverter, and starting the reset period.

The second capacitor 408A continues to recharge after T4, eventually increasing the voltage of the first terminal 424A back to the threshold voltage of the inverter. Because the signals 702, 704 were at different voltages due to the differences in the INP signal 104A and the INM signal 104B, the first terminal 424A from the sample and conversion circuitry 302A also satisfies the threshold voltage at a different point in time than the sample and conversion circuitry 302B. For example, the signal 702 (corresponding to the sample and conversion circuitry 302A) satisfies the threshold at T5, while the signal 704 satisfies the threshold later at T6. This difference in time (e.g., a delay) between the thresholds directly causes the delay to occur between a falling edge of the DLYP signal 204A and a falling edge of the DLYM signal 206A.

The VTD circuitry 202 provides the DLYP signal 204A and the DLYM signal 206A to the DTD circuitry 208, which uses the difference in time between rising edges to produce k digital bits corresponding to the input signals 104A, 104B. The TA signal 308 is referred to as a time amplification signal because the difference in time between falling edges of the DLYP signal 204A and the DLYM signal 206A may be amplified relative to the difference in time between when first terminal 424A of the sample and conversion circuitry 302A satisfies the threshold voltage and when the first terminal 424A of the sample and conversion circuitry 302B satisfies the threshold voltage.

The voltage of the first terminal 424A satisfying the threshold voltage at T5 and T6 the inverters (e.g., the sixth transistors 416A and seventh transistors 418A), causing the second capacitor 408A to finish charging through positive feedback created by the fourth transistor 412A and the fifth transistor 414A. By T7, the second capacitor 408A in both the sample and conversion circuitry 302A and the sample and conversion circuitry 302B have finished charging, so the controller circuitry 304 ends the VTD period, the reset period, and more generally, the conversion cycle. The falling pulse edge in the output reset signal 312A at T7 also causes a rising pulse edge in both the DLYP signal 204A and the DLYM signal 206A.

FIG. 7 shows how, advantageously, the voltage of the first terminal 424A begins to charge at the start of the VTD period (e.g., at T4) in examples described herein. As a result, the duplicated architecture instance 428A can finish recharging the second capacitor 408A and end the conversion cycle in less time than some other solutions may be able to do so, resulting in the VTD circuitry 202 exhibiting improved speed over other VTD architectures. FIG. 7 also shows how, advantageously, the second capacitor 408A does not fully discharge during the conversion cycle, thereby decreasing power consumption and increasing linearity when compared to other VTD architectures.

While an example manner of implementing the VTD circuitry 202 of FIG. 2 is illustrated in FIGS. 3, one or more of the elements, processes, and/or devices illustrated in FIG. 3 may be combined, divided, re-arranged, omitted, eliminated, and/or implemented in any other way. Further, the sample and conversion circuitry 302A, the sample and conversion circuitry 302B, the controller circuitry 304, and/or, more generally, the VTD circuitry 202 of FIG. 3, may be implemented by hardware alone or by hardware in combination with software and/or firmware. Thus, for example, any of the sample and conversion circuitry 302A, the sample and conversion circuitry 302B, the controller circuitry 304, and/or, more generally, the VTD circuitry 202, could be implemented by programmable circuitry in combination with machine readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)). ASIC(s), programmable logic device(s) (PLD(s)), and/or field programmable logic device(s) (FPLD(s)) such as FPGAs. Further still, the VTD circuitry 202 of FIG. 3 may include one or more elements, processes, and/or devices in addition to, or instead of, those illustrated in FIG. 3, and/or may include more than one of any or all of the illustrated elements, processes and devices.

Figure 8:
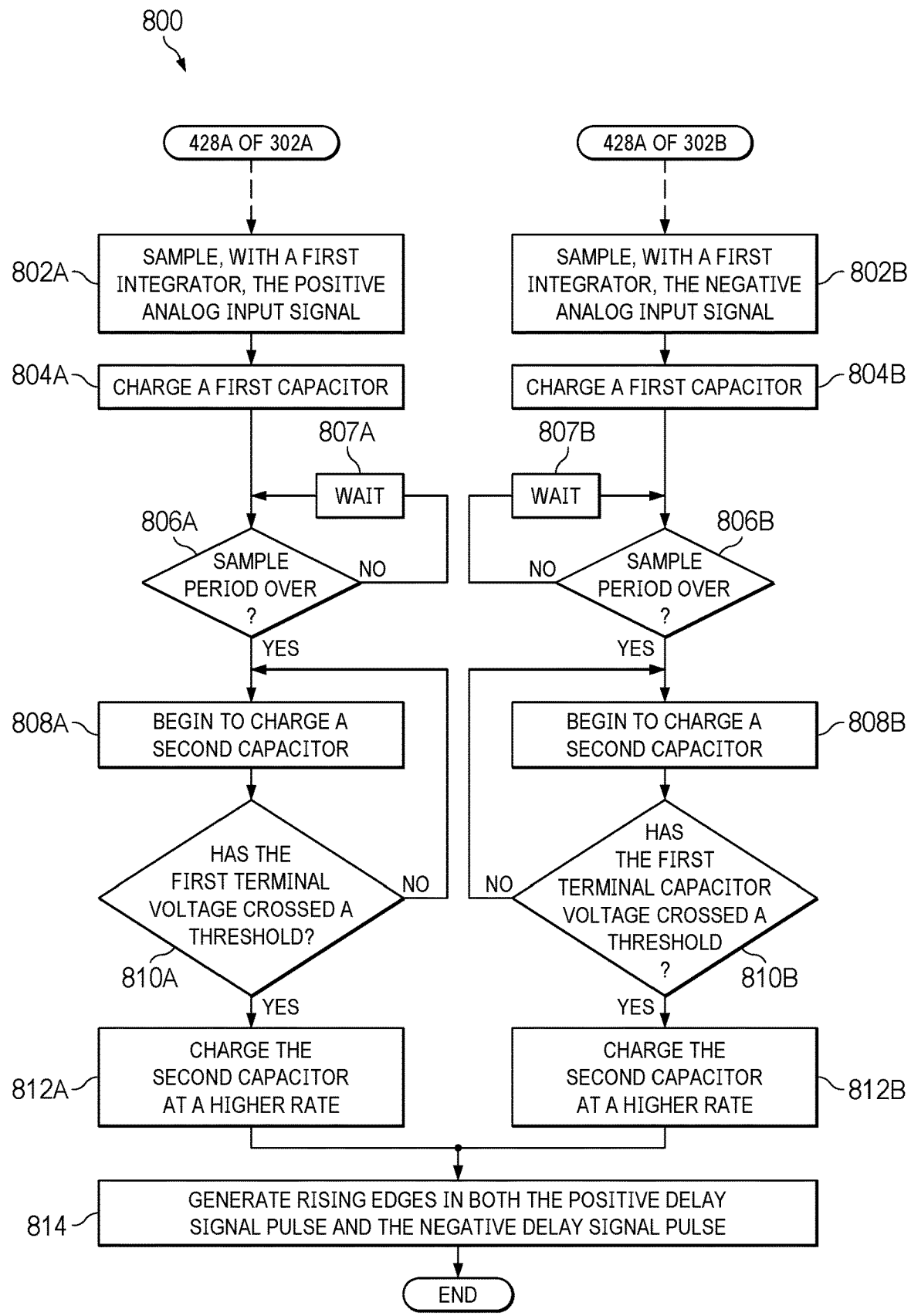
FIG. 8 is a flowchart representative of an example process that may be performed using machine readable instructions that can be executed and/or hardware configured to implement the controller circuitry 304 of FIG. 3, and/or more generally, the VTD circuitry of FIG. 2 to convert an analog signal to a delay signal corresponding to a first sample.
Figure 9:
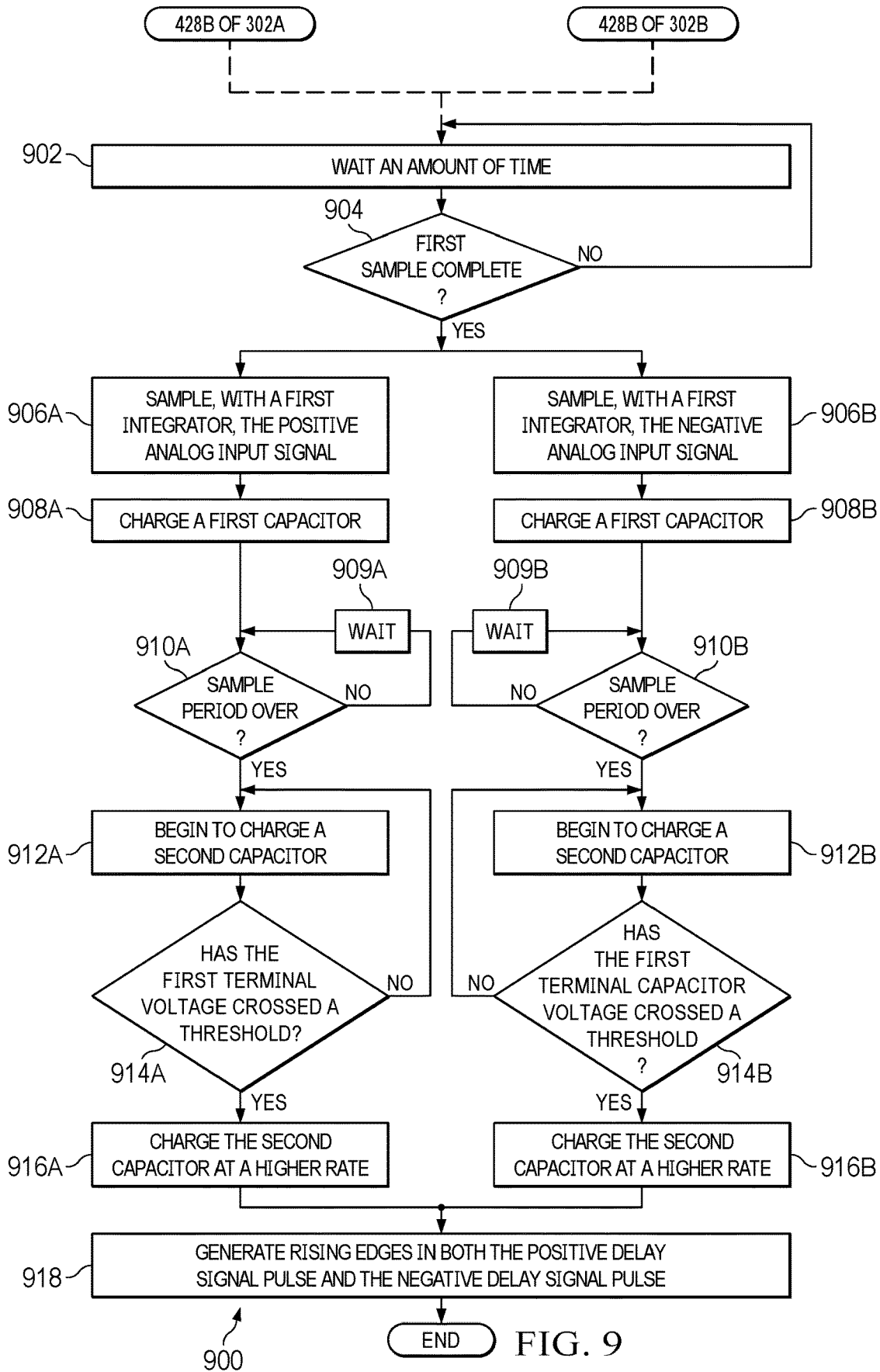
FIG. 9 is a flowchart representative of an example process that may be performed using machine readable instructions that can be executed and/or hardware configured to implement the controller circuitry 304 of FIG. 3, and/or, more generally, the VTD circuitry of FIG. 2 to convert an analog signal to a delay signal corresponding to a second sample.

Flowchart(s) representative of example machine readable instructions, which may be executed by programmable circuitry to implement and/or instantiate the VTD circuitry 202 of FIG. 3 and/or representative of example operations which may be performed by programmable circuitry to implement and/or instantiate the VTD circuitry 202 of FIG. 3, are shown in FIGS. 8 and 9. The machine readable instructions may be one or more executable programs or portion(s) of one or more executable programs for execution by programmable circuitry such as the programmable circuitry 1012 shown in the example programmable circuitry platform 1000 described below in connection with FIG. 10 and/or may be one or more function(s) or portion(s) of functions to be performed by the example programmable circuitry (e.g., an FPGA). In some examples, the machine-readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer readable and/or machine readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine-readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine-readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 8 and 9, many other methods of implementing the VTD circuitry 202 may alternatively be used. For example, the order of execution of the blocks of the flowchart(s) may be changed, and/or some of the blocks described may be changed, eliminated, or combined. Additionally or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine-readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine-readable instructions may be fragmented and stored on one or more storage devices, disks and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of computer-executable and/or machine executable instructions that implement one or more functions and/or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine readable, computer readable and/or machine-readable media, as used herein, may include instructions and/or program(s) regardless of the particular format or state of the machine-readable instructions and/or program(s).

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 8 and 9 may be implemented using executable instructions (e.g., computer readable and/or machine-readable instructions) stored on one or more non-transitory computer readable and/or machine-readable media. As used herein, the terms non-transitory computer readable medium, non-transitory computer readable storage medium, non-transitory machine readable medium, and/or non-transitory machine-readable storage medium are expressly defined to include any type of computer readable storage device and/or storage disk and to exclude propagating signals and to exclude transmission media. Examples of such non-transitory computer readable medium, non-transitory computer readable storage medium, non-transitory machine readable medium, and/or non-transitory machine readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine-readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine-readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B. (5) A with C. (6) B with C, or (7) A with B and with C. As used herein in the context of describing structures, components, items, objects and/or things, the phrase "at least one of A and B" is intended to refer to implementations including any of (1) at least one A. (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A. (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible and/or advantageous.

FIG. 8 is a flowchart representative of an example process that may be performed using machine readable instructions that can be executed and/or hardware to implement the controller circuitry 304 of FIG. 3, and/or, more generally, the VTD circuitry 202 of FIG. 2 to convert an analog signal to a delay signal corresponding to a first sample. The example flowchart of FIG. 8 is divided into two columns such that the blocks in the "428A of 302A" column correspond to signals sent from the controller circuitry 304 to the duplicated architecture instance 428A in the sample and conversion circuitry 302A. Similarly, blocks within the "428A of 302B" column correspond to signals sent from the controller circuitry 304 to the duplicated architecture instance 428A in sample and conversion circuitry 302B.

The machine-readable instructions and/or operations 800 begin when the controller circuitry 304 causes the integrator to sample the INP signal 104A. (Block 802A). To cause the integrator to sample the INP signal 104A, the controller circuitry 304 transmits a rising edge of a pulse in the sample signal 306A. At the same time as block 802A, the controller circuitry 304 also transmits the rising edge to the sample and conversion circuitry 302B, causing an integrator to begin sampling the INM signal 104B (Block 802B). The second capacitor 408A begins to discharge and the voltages of the first terminals 424A decrease during blocks 802A and 802B. As shown in FIG. 7, the voltages of the first terminals 424A decrease at different rates during the sample period.

After blocks 802A and 802B, the controller circuitry 304 charges the first capacitor 406A in the sample and conversion circuitry 302A (Block 804A). At the same time, the controller circuitry 304 charges the first capacitor 406A in the sample and conversion circuitry 302B (Block 804B). To charge the first capacitor 406A, the controller circuitry 304 transmits a rising pulse edge in the kick signal 310A. Accordingly, the first terminals 424A decrease voltage at a slower rate at blocks 804A and 804B than at blocks 802A and 802B.

The controller circuitry 304 determines whether the sample period of the INP signal 104A is over. (Block 806A). At the same time, the controller circuitry determines whether the sample period of the INM signal 104B is over. (Block 806B). Because the INP signal 104A and the INM signal 104B are two parts of a differential signal that are interpreted together, the sample period of block 806A is equal in length to the sample period of block 806B. In some examples, the length of the sample period is configured based on the transmission rate of the voltage source 102.

If the controller circuitry 304 determines the sample period is not over (Block 804A: No and Block 804B: No), the controller waits for a period (Block 807A and Block 807B). While waiting, the first capacitor 406A continues to charge and the second capacitor 408A continues to discharge, resulting in the voltage of the first terminals 424A decreasing at a relatively slow rate. Control returns to blocks 806A and 806B after blocks 807A and 807B.

If the controller circuitry 304 determines the sample period is over (Block 804A: Yes, and Block 804B: Yes), the controller circuitry 304 begins to recharge the second capacitors 408A. (Block 808A and 808B). To begin recharging the second capacitors 408A, the controller circuitry 304 transmits a rising pulse edge in the TA signal 308A. Accordingly, the VTD period begins at blocks 808A and 808B (e.g., at T2 as described in FIGS. 6 and 7 above).

The controller circuitry 304 determines whether the voltage of the first terminal 424 from the sample and conversion circuitry 302A has crossed a threshold. (Block 810A). In some examples, the controller circuitry 304 uses an empirically measured and/or pre-determined charge rate of the second capacitor 408A to determine the voltage of the first terminal 424A. For instance, the controller circuitry 304 may determine the voltage of the second capacitor 408A by using the amount of time since the start of the capacitor charge and the charge rate to determine a total voltage gain. If the voltage of the second capacitor 408A from the sample and conversion circuitry 302A has not crossed the voltage threshold (Block 810A: No), control returns to block 806A, where the second capacitor 408A continues to charge and the voltage at the first terminal 424A continues to increase. In other examples, the threshold of blocks 810A, 810B may be a pre-determined value based on the value of VDD and/or the components used to implement the inverter.

Similarly, the controller circuitry 304 determines whether the voltage of the second capacitor 408A from the sample and conversion circuitry 302B has crossed the threshold. (Block 810B). As described above, the controller circuitry 304 also uses the empirically measured and/or pre-determined charge rate to determine the voltage of the first terminal 424A. If the voltage of the second capacitor 408A from the sample and conversion circuitry 302B has not crossed the threshold (Block 808B: No), control returns to block 806B, where the second capacitor 408A continues to charge and the voltage at the first terminal 424A continues to increase.

After the voltage of the first terminal 424A from the sample and conversion circuitry 302A has crossed the threshold (Block 810A: Yes), the inverter in the duplicated architecture instance 428A is triggered and the second capacitor 408A is charged at a higher rate. (Block 812A). Triggering the inverter also generates a falling edge of the pulse in the DLYP signal 204A, which is provided to the DTD circuitry 208.

Similarly, after the voltage of the first terminal 424A from the sample and conversion circuitry 302B has crossed the threshold (Block 808B: Yes), the inverter in the duplicated architecture instance 428A is triggered and the second capacitor 408A is charged at a higher rate. (Block 812B). Triggering the inverter also generates a rising edge of the pulse in the DLYM signal 204A. Because the first terminal 424A in the sample and conversion circuitry 302B discharged at a different rate than the first terminal 424A in the sample and conversion circuitry 302A, the falling edge of the pulse in the DLYM signal 206A occurs at a different point in time than the rising edge of the pulse in the DLYP signal 204A.

Once the second capacitor 408A has fully charged, the controller circuitry 304 generates a rising edge for both the DLYP signal 204A pulse and the DLYM signal 206A pulse. (Block 814). To generate the rising edge of the delay signals, the controller circuitry 304 provides a falling edge pulse in the output reset signal 312A (e.g., at T7 in FIGS. 6 and 7). The machine-readable instructions and/or operations 800 end after the DLYP signal 204A and the DLYM signal 206A return to a low supply voltage. Accordingly, after block 814, the conversion cycle is complete and both duplicated architecture instances 428A can perform subsequent samples of the input signals.

Because the differential nature of the input signals 104A, 104B causes the mirrored instances of the sample and conversion circuitry 302A. 302B to generate a falling edge of pulses in the DLYP signal 204A and the DLYM signal 206A at different times, the controller circuitry 304 causes the rising edges of the DLYP signal 204A and the DLYM signal 206A to occur concurrently (e.g., at the same time) in Block 814. As a result, the width of the pulse (e.g., the amount of time a high supply voltage is exhibited) in the DLYP signal 204A is different from the width of the pulse in the DLYM signal 206A. This difference in rising edges of the two pulses enables the DTD circuitry 208 to generate digital bits corresponding to the input signals 104A, 104B.

FIG. 9 is a flowchart representative of an example process that may be performed using machine readable instructions that can be executed and/or hardware to implement the controller circuitry 304 of FIG. 3, and/or, more generally, the VTD circuitry 202 of FIG. 2 to convert an analog signal to a delay signal corresponding to a second sample. The example flowchart of FIG. 9 is divided into two columns such that the blocks in the "428B of 302A" column correspond to signals sent from the controller circuitry 304 to the duplicated architecture instance 428B in the sample and conversion circuitry 302A. Similarly, blocks within the "428B of 302B" column correspond to signals sent from the controller circuitry 304 to the duplicated architecture instance 428B in sample and conversion circuitry 302B.

The machine-readable instructions and/or operations 900 begin when the controller circuitry 304 waits an amount of time. (Block 902). During the wait period of block 902, the first duplicated architecture instances 428A of the sample and conversion circuitry 302A and 302B sample the input signal 104A, 104B a first time (Block 802A and Block 802B). After an amount of time, the controller circuitry 304 determines whether the first sample is complete (Block 904). If the first sample is not complete (Block 904: No), control returns to block 902, where the controller circuitry 304 continues to wait.

If the controller circuitry 304 determines the first sample is complete (Block 904: Yes), the controller circuitry 304 causes the duplicated architecture instance 428B of the sample and conversion circuitry 302A to sample the INP signal 104A. (Block 906A). After completion of the first sample (Block 904: Yes), the controller circuitry 304 also causes the duplicated architecture instance 428B of the sample and conversion circuitry 302B to sample the INM signal 104B. (Block 906B). To cause the duplicated architecture instances 428B to sample the input signals 104A, 104B, the controller circuitry 304 transmits a rising edge of a pulse in the sample signal 306B to both instances of the sample and conversion circuitry 302A and 302B.

When implementing blocks 906A-918 of FIG. 9, the controller circuitry 304 mirrors the operations of blocks 802A-814 of FIG. 8, respectively. However, while the flowchart of FIG. 8 describe signals sent from the controller circuitry 304 that cause the duplicated architecture instances 428A to produce pulses in the DLYP signal 204A and DLYM signal 206A, the flowchart of FIG. 9 describes signals from the controller circuitry 304 that cause the duplicated architecture instances 428B to produce pulses in the DLYP signal 204B and DLYM signal 206B.

Notably, the execution of blocks 906A-918 of FIG. 9 are shifted in time relative to the execution of 802A-814. In particular, the controller circuitry 304 coordinates pulses in the sample signals 306A, 306B such that execution of blocks 906A, 906B do not begin until execution of blocks 802A, 802B begin. As a result, the duplicated architecture instance 428$n$ does not sample the input signal until all duplicated architecture instances 428A, 428B, . . . 428($n$–1) have sampled the input signal, and the duplicated architecture instance 428A does not sample the input signal a second time until all n duplicated architecture instances 422 have sampled the input signal a first time (as shown in FIG. 6).

Figure 10:
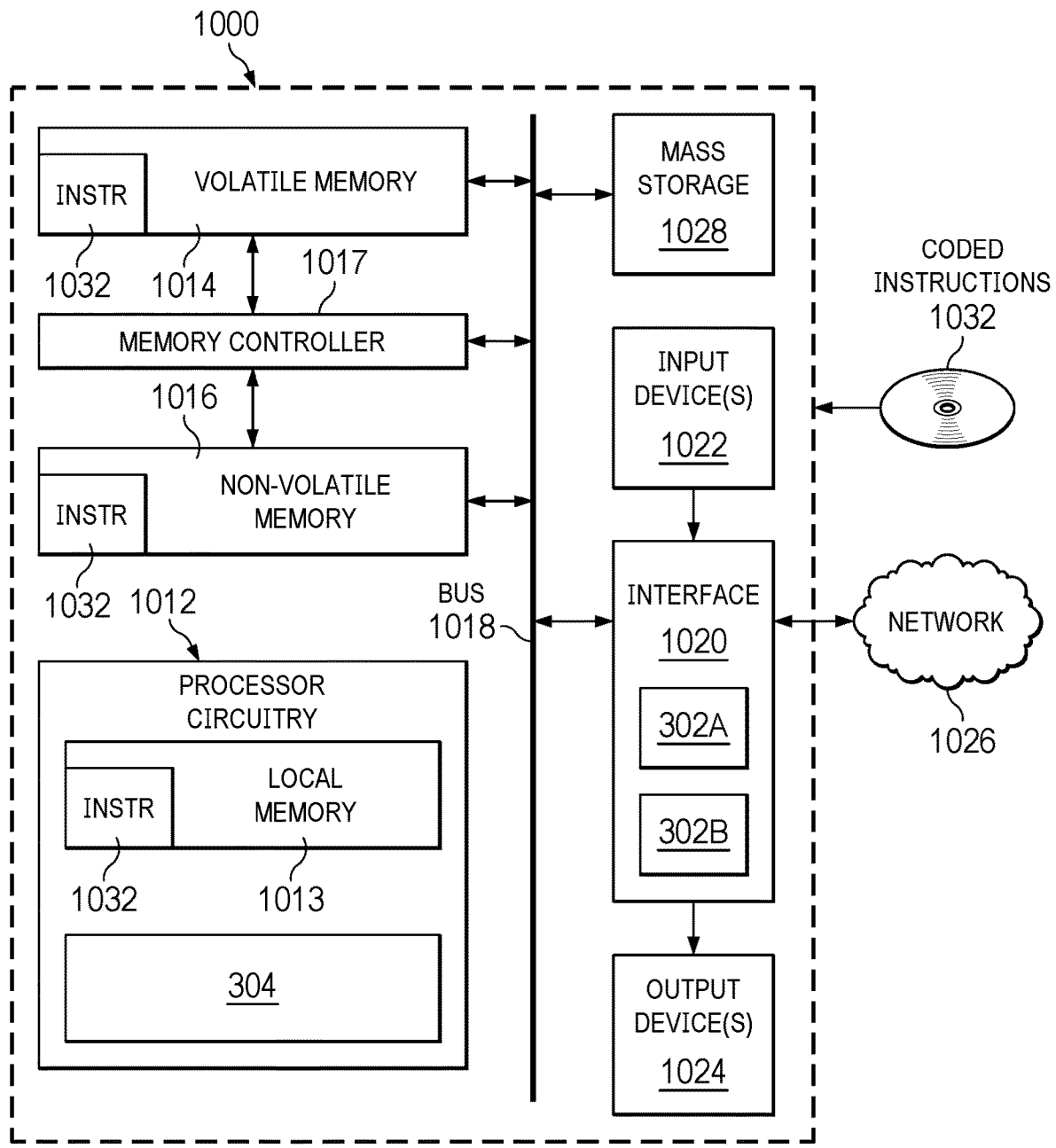
FIG. 10 is a block diagram of an example processing platform including processor circuitry structured to execute the example machine readable instructions and/or the example operations of FIGS. 8 and 9 to implement the controller circuitry of FIG. 3.

FIG. 10 is a block diagram of an example programmable circuitry platform 1000 structured to execute and/or instantiate the example machine-readable instructions and/or the example operations of FIGS. 8 and 9 to implement the VTD circuitry 202 of FIG. 3. The programmable circuitry platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 1000 of the illustrated example includes programmable circuitry 1012. The programmable circuitry 1012 of the illustrated example is hardware. For example, the programmable circuitry 1012 can be implemented by one or more integrated circuits, logic circuits, FPGAs, microprocessors, CPUs, GPUs, DSPs, and/or microcontrollers from any desired family or manufacturer. The programmable circuitry 1012 may be implemented by one or more semiconductor based (e.g., silicon based) devices. In this example, the programmable circuitry 1012 implements the controller circuitry 304.

The programmable circuitry 1012 of the illustrated example includes a local memory 1013 (e.g., a cache, registers, etc.). The programmable circuitry 1012 of the illustrated example is in communication with main memory 1014, 1016, which includes a volatile memory 1014 and a non-volatile memory 1016, by a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1016 may be implemented by flash memory and/or any other desired type of memory device. Access to the main memory 1014, 1016 of the illustrated example is controlled by a memory controller 1017. In some examples, the memory controller 1017 may be implemented by one or more integrated circuits, logic circuits, microcontrollers from any desired family or manufacturer, or any other type of circuitry to manage the flow of data going to and from the main memory 1014, 1016.

The programmable circuitry platform 1000 of the illustrated example also includes interface circuitry 1020. The interface circuitry 1020 may be implemented by hardware described in any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1022 are connected to the interface circuitry 1020. The input device(s) 1022 permit(s) a user (e.g., a human user, a machine user, etc.) to enter data and/or commands into the programmable circuitry 1012. The input device(s) 1022 can be implemented by, for example, an audio sensor, a microphone, a camera (still or video), a keyboard, a button, a mouse, a touchscreen, a trackpad, a trackball, an isopoint device, and/or a voice recognition system.

One or more output devices 1024 are also connected to the interface circuitry 1020 of the illustrated example. The output device(s) 1024 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1020 of the illustrated example, thus, generally includes a graphics driver card, a graphics driver chip, and/or graphics processor circuitry such as a GPU. In this example, the interface circuitry 1020 implements both instances of the sample and conversion circuitry 302A and 302B.

The interface circuitry 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1026. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 1000 of the illustrated example also includes one or more mass storage discs or devices 1028 to store firmware, software, and/or data. Examples of such mass storage discs or devices 1028 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine-readable instructions 1032, which may be implemented by the machine readable instructions of FIGS. 8 and 9, may be stored in the mass storage device 1028, in the volatile memory 1014, in the non-volatile memory 1016, and/or on at least one non-transitory computer readable storage medium such as a CD or DVD which may be removable.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first", "second", "third", etc. are used merely to distinguish between elements of substantially the same type in terms of structure and/or function. These identifiers used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

From the foregoing, it will be appreciated that example systems, apparatus, articles of manufacture, and methods have been described that improves speed, noise, power consumption, and linearity of VTD circuitry. Described systems, apparatus, articles of manufacture, and methods improve the efficiency of using a computing device by implementing a new circuitry architecture such that configured such that the VTD conversion occurs while the duplicated architecture instance is resetting, thereby increasing the speed of a conversion cycle. Duplicated architecture instances in the new VTD circuitry described herein are configured to receive a kick signal that both: (a) lowers the voltage of the first terminal to a value that increases the gain of the circuit and begins the voltage to delay conversion, and (b) facilitates that the decreased voltage of the first terminal is not so low that headroom saturation margin and linearity decrease. Duplicated architecture instances in the new VTD circuitry described herein also receive a reset signal that prevents the inverter from triggering during the sampling period (e.g., the window of time in which the kick signal causes the first terminal to cross a threshold voltage that would otherwise trigger the inverter). Accordingly, the new VTD circuitry described herein exhibits improved SNR and bandwidth over previous solutions while also improving the speed, noise, power consumption, and linearity. In some examples, the new VTD circuitry described herein supports use cases that require >18 Giga Hertz (GHz) input bandwidth while simultaneously scanning an input signal with a frequency that varies between 0 to 40 GHz. Described systems, apparatus, articles of manufacture, and methods are accordingly directed to one or more improvement(s) in the operation of a machine such as a computer or other electronic and/or mechanical device.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent.

Modifications are possible in the described embodiments, and other embodiments are possible, within the scope of the claims.

What is claimed is:

1. An apparatus to convert a voltage to a delay signal, the apparatus comprising:
    a first transistor having: a gate configured to receive an analog input signal, a source coupled to ground, and a drain;
    a second transistor having: a gate configured to receive a first control signal, a source coupled to the drain of the first transistor, and a drain configured to receive a supply voltage (VDD) via a first terminal;
    a first capacitor having: a positive terminal coupled to the first terminal, and a negative terminal configured to receive a second control signal;
    a second capacitor having: a positive terminal coupled to the first terminal, and a negative terminal configured to receive the supply voltage;
    a third transistor having: a gate configured to receive a third control signal, a source, and a drain coupled to the first terminal;
    a fourth transistor having: a gate configured to receive a bias voltage, a source configured to receive the supply voltage, and a drain coupled to the source of the third transistor;
    a fifth transistor having: a gate, a source configured to receive the supply voltage, and a drain coupled to the source of the third transistor;
    a sixth transistor having: a gate coupled to the first terminal, a source configured to receive the supply voltage, and a drain;
    a seventh transistor having: a gate coupled to the first terminal, a source coupled to ground, and a drain;
    an eighth transistor having: a gate configured to receive a fourth control signal, a source configured to receive the supply voltage, and a drain coupled to the drain of the sixth transistor via a second terminal; and
    a ninth transistor having: a gate configured to receive the fourth control signal, a source coupled to the drain of the seventh transistor, and a drain coupled to the second terminal.

2. The apparatus of claim 1, wherein the apparatus is configured to: (a) perform a voltage to delay conversion of the analog input signal, (b) reset the voltage of the second capacitor, and (c) increase a voltage of the first terminal, within the same period.

3. The apparatus of claim 1, wherein the first capacitor is configured to receive a kick voltage in the second control signal, the kick voltage to slow a rate at which a voltage of the first terminal decreases during a sample of the analog input signal.

4. The apparatus of claim 3, wherein:
    the voltage of the first terminal decreases to cross a threshold voltage after the first capacitor receives the kick voltage;
    the sixth transistor and the seventh transistor collectively form an inverter that, when enabled, is configured to activate when the voltage of the first terminal crosses the threshold voltage;
    the eighth transistor and the ninth transistor collectively form an inverter activation controller that is configured to temporarily disable the inverter; and
    the fourth control signal causes the inverter activation controller to disable the inverter when the voltage of the first terminal decreases to cross the threshold voltage.

5. The apparatus of claim 4, wherein:
    after the decrease of the voltage at the first terminal, the fourth control signal causes the inverter activation controller to enable the inverter during a subsequent increase of the voltage of the first terminal; and
    when enabled and activated during the subsequent increase, the inverter increases a rate at which the voltage of the first terminal increases.

6. The apparatus of claim 1, wherein:
the second transistor, the first capacitor, the second capacitor, the third transistor, the fourth transistor, the fifth transistor, the sixth transistor, the seventh transistor, the eighth transistor, and the ninth transistor collectively form a first set of circuit elements; and
the apparatus further includes a second set of circuit elements, the second set of circuit elements having the same components and same connections as the first set.

7. The apparatus of claim 6, wherein:
the analog input signal includes a positive differential signal and a negative differential signal;
the first set of circuit elements and the second set of circuit elements collectively form a first half circuit configured to convert the positive differential signal into a first delay signal; and
the apparatus further includes a second half circuit, the second half circuit having the same components and same connections as the first half circuit, the second half circuit configured to convert the negative differential signal into a second delay signal, wherein a difference in time between a falling edge of the first delay signal and a corresponding edge of the second delay signal encodes a state of the analog input signal.

8. The apparatus of claim 1, wherein the apparatus further includes:
a third capacitor having: a negative terminal coupled to the gate of the first transistor, and a positive terminal;
a resistor having: a first terminal coupled to the positive terminal of the second capacitor, and a second terminal configured to receive to an input common mode signal; and
a tenth transistor having: a gate coupled to the positive terminal of the third capacitor, a source coupled to ground, and a drain coupled to the drain of the first transistor.

9. The apparatus of claim 8, wherein the third capacitor, the resistor and the tenth transistor collectively form a high pass filter.

10. The apparatus of claim 8, wherein the third capacitor, the resistor and the tenth transistor collectively form a high pass filter.

11. An apparatus to convert an analog input signal to a digital signal, the apparatus comprising:
controller circuitry configured to transmit a first control signal, a second control signal, a third control signal, and a fourth control signal;
two first transistors both having: a gate configured to receive an analog input signal, a source coupled to ground, and a drain;
two second transistors both having: a gate configured to receive a first control signal, a source coupled to the drain of the first transistor, and a drain configured to receive a supply voltage (VDD) via a first terminal;
two first capacitors both having: a positive terminal coupled to the first terminal, and a negative terminal configured to receive a second control signal;
two second capacitors both having: a positive terminal coupled to the first terminal, and a negative terminal configured to receive the supply voltage;
two third transistors both having: a gate configured to receive a third control signal, a source, and a drain coupled to the first terminal;
two fourth transistors both having: a gate configured to receive a bias voltage, a source configured to receive the supply voltage, and a drain coupled to the source of the third transistor;
two fifth transistors both having: a gate, a source configured to receive the supply voltage, and a drain coupled to the source of the third transistor;
two sixth transistors both having: a gate coupled to the first terminal, a source configured to receive the supply voltage, and a drain;
two seventh transistors both having: a gate coupled to the first terminal, a source coupled to ground, and a drain;
two eighth transistors both having: a gate configured to receive a fourth control signal, a source configured to receive the supply voltage, and a drain coupled to the drain of the sixth transistor via a second terminal;
two ninth transistors both having: a gate configured to receive the fourth control signal, a source coupled to the drain of the seventh transistor, and a drain coupled to the second terminal; and
delay to digital circuitry configured to:
obtain a first delay signal from the drain of the first of the eighth transistors;
obtain a second delay signal from the drain of the second of the eighth transistors; and
determine a value of the digital signal based on the first delay signal and the second delay signal.

12. The apparatus of claim 11, wherein:
the analog input signal includes a positive differential signal and a negative differential signal;
a first of the first transistor, the second transistor, the first capacitor, the third transistor, the second capacitor, the fourth transistor, the fifth transistor, the sixth transistor, the seventh transistor, the eighth transistor, and the ninth transistor collectively form a first half circuit configured to convert the positive differential signal into the first delay signal;
a second of the first transistor, the second transistor, the first capacitor, the third transistor, the second capacitor, the fourth transistor, the fifth transistor, the sixth transistor, the seventh transistor, the eighth transistor, and the ninth transistor collectively form a second half circuit configured to convert the negative differential signal into the second delay signal; and
the delay to digital circuitry is configured to determine a value of the digital signal based on a difference in time between a falling edge of the first delay signal and a corresponding edge of the second delay signal.

13. The apparatus of claim 12, wherein, within the first half circuit, the apparatus is configured to: (a) perform a voltage to delay conversion of the analog input signal within the first half circuit, (b) reset the voltage of the second capacitor within the first half circuit, and (c) increase a voltage of the first terminal, within the same period.

14. The apparatus of claim 12, wherein, within the first half circuit, the first capacitor is configured to receive a kick voltage in the second control signal, the kick voltage to slow a rate at which a voltage of the first terminal in the first half circuit decreases during a sample of the analog input signal.

15. The apparatus of claim 14, wherein:
the voltage of the first terminal decreases to cross a threshold voltage after the first capacitor receives the kick voltage;
the sixth transistor and the seventh transistor collectively form an inverter that, when enabled, is configured to activate when the voltage of the first terminal crosses the threshold voltage;
the eighth transistor and the ninth transistor collectively form an inverter activation controller that is configured to temporarily disable the inverter; and the fourth control signal causes the inverter activation controller to disable the inverter when the voltage of the first terminal decreases to cross the threshold voltage.

16. The apparatus of claim 15, wherein:
after the decrease of the voltage at the first terminal, the fourth control signal causes the inverter activation controller to enable the inverter during a subsequent increase of the voltage of the first terminal; and
when enabled and activated during the subsequent increase, the inverter increases a rate at which the voltage of the first terminal increases.

17. The apparatus of claim 12, wherein
the first of the second transistor, the first capacitor, the third transistor, the second capacitor, the fourth transistor, the fifth transistor, the sixth transistor, the seventh transistor, the eighth transistor, and the ninth transistor collectively form a first set of circuit elements within the first half circuit; and
the first half circuit further includes a second set of circuit elements, the second set of circuit elements having the same components and same connections as the first set.

18. The apparatus of claim 12, wherein the first half circuit further includes:
a third capacitor having: a negative terminal coupled to the gate of the first transistor, and a positive terminal;
a resistor having: a first terminal coupled to the positive terminal of the second capacitor, and a second terminal configured to receive to an input common mode signal; and
a tenth transistor having: a gate coupled to the positive terminal of the third capacitor, a source coupled to ground, and a drain coupled to the drain of the first transistor.

19. A method to convert an analog voltage to a delay signal, the method comprising:
providing, by executing instructions with programmable circuitry, a first sample signal, a first time amplification (TA) signal, and a first kick signal to first sample and conversion circuitry;
providing, by executing instructions with programmable circuitry, a second sample signal, a second TA signal, a second kick signal, and a second output reset signal to second sample and conversion circuitry;
sampling, with the first sample and conversion circuitry, a positive differential signal for a first amount of time-based on the first sample signal;
sampling, with the second sample and conversion circuitry, a negative differential signal for the first amount of time-based on the second sample signal;
charging a first capacitor within the first sample and conversion circuitry for a second amount of time-based on the first kick signal;
charging a first capacitor within the second sample and conversion circuitry for the second amount of time-based on the second kick signal;
after the first amount of time and the second amount of time, charging a second capacitor in the first sample and conversion circuitry, the charging based on the first TA signal, the charging to cause a falling edge in a first delay signal;
after the first amount of time and the second amount of time, charging a second capacitor in the second sample and conversion circuitry, the charging based on the second TA signal, the charging to cause a falling edge in a second delay signal; and
generating, a first falling edge in the first delay signal and a second falling edge in the second delay signal, the first falling edge and the second rising edge to occur concurrently.

20. The method of claim 19, further including:
within the first sample and conversion circuitry: (a) performing a voltage to delay conversion of the positive differential signal, (b) resetting the voltage of the second capacitor, and (c) increase a voltage of a first terminal, within the same period; and
within the second sample and conversion circuitry: (a) performing a voltage to delay conversion of the negative differential signal, (b) resetting the voltage of the second capacitor, and (c) increase a voltage of a first terminal, within the same period.

* * * * *